(12) United States Patent
Osann, Jr.

(10) Patent No.: US 7,679,398 B2
(45) Date of Patent: Mar. 16, 2010

(54) REPROGRAMMABLE INSTRUCTION DSP

(76) Inventor: Robert Osann, Jr., 10494 Ann Arbor Ave., Cupertino, CA (US) 95014

( * ) Notice: Subject to any disclaimer, the term of this patent is extended or adjusted under 35 U.S.C. 154(b) by 1731 days.

(21) Appl. No.: 10/621,957

(22) Filed: Jul. 16, 2003

(65) Prior Publication Data

US 2008/0094102 A1 Apr. 24, 2008

Related U.S. Application Data

(60) Provisional application No. 60/396,375, filed on Jul. 17, 2002.

(51) Int. Cl.
*H01L 25/00* (2006.01)
*H03K 19/177* (2006.01)
(52) U.S. Cl. .............................. 326/38; 326/39; 326/41
(58) Field of Classification Search ........................ None
See application file for complete search history.

(56) References Cited

U.S. PATENT DOCUMENTS

| | | | |
|---|---|---|---|
| 6,020,755 A | 2/2000 | Andrews et al. | |
| 6,093,214 A | 7/2000 | Dillon | |
| 6,236,229 B1 | 5/2001 | Or-Bach | |
| 6,301,696 B1 | 10/2001 | Lien et al. | |
| 6,609,244 B2 | 8/2003 | Kato et al. | |
| 6,744,278 B1 | 6/2004 | Liu et al. | |
| 6,754,881 B2 | 6/2004 | Kuhlmann et al. | |
| 6,781,408 B1 * | 8/2004 | Langhammer | 326/41 |
| 6,798,239 B2 | 9/2004 | Douglass et al. | |
| 6,826,674 B1 * | 11/2004 | Sato | 712/200 |
| 6,857,110 B1 | 2/2005 | Rupp et al. | |
| 6,886,092 B1 * | 4/2005 | Douglass et al. | 712/37 |
| 6,961,919 B1 * | 11/2005 | Douglass | 716/18 |
| 7,143,376 B1 | 11/2006 | Eccles | |

OTHER PUBLICATIONS

Office Action, mailed Feb. 23, 2005, for U.S. Appl. No. 10/639,336.
Office Action, mailed Sep. 6, 2005, for U.S. Appl. No. 10/639,336.

(Continued)

*Primary Examiner*—Anh Q Tran
(74) *Attorney, Agent, or Firm*—Schwabe, Williamson & Wyatt P.C.

(57) ABSTRACT

A software programmable DSP with a field programmable instruction set is described where customized instructions can be created, or certain existing instructions can be modified, at the user's location after taking delivery of the processor. The FPGA fabric used to implement the reprogrammable instructions is restricted to supporting the software-programmable DSP—never functioning as an independent coprocessor—and therefore enabling the reprogrammable instructions to exist in the normal stream of DSP software execution. DSP-type functions implemented in the FPGA fabric are also restricted to being automatically generated such that they are synchronous with the processor clocks—enabling easy conversion to an ASIC. Designs implemented on a die containing a DSP with an FPGA-style reprogrammable instruction fabric may be migrated to a smaller die within a family of DSP die containing hard-wired ASIC instruction fabrics, all members of this ASIC family having common I/O functionality to enable operation in the same system socket.

26 Claims, 25 Drawing Sheets

OTHER PUBLICATIONS

Notice of Allowability, mailed Mar. 24, 2006, for U.S. Appl. No. 10/639,336.
Office Action, mailed Dec. 8, 2008, for U.S Appl. No. 11/474,876.
Notice of Allowability, mailed Jun. 17, 2009, for U.S. Appl. No. 11/474,876.
Office Action, mailed Dec. 2, 2008, for U.S. Appl. No. 12/191,947.
Francesco Lertora (Speaker), Benoit Foret, Lorenzo Cali, Michele Borgatti, "A Customized Processor For Face Recognition", Proceeding of 2002 Embedded Processor Forum, May 2002, San Jose, California.
Notice of Allowability for U.S. Appl. No. 11/474,876, mailed Nov. 19, 2009.

* cited by examiner

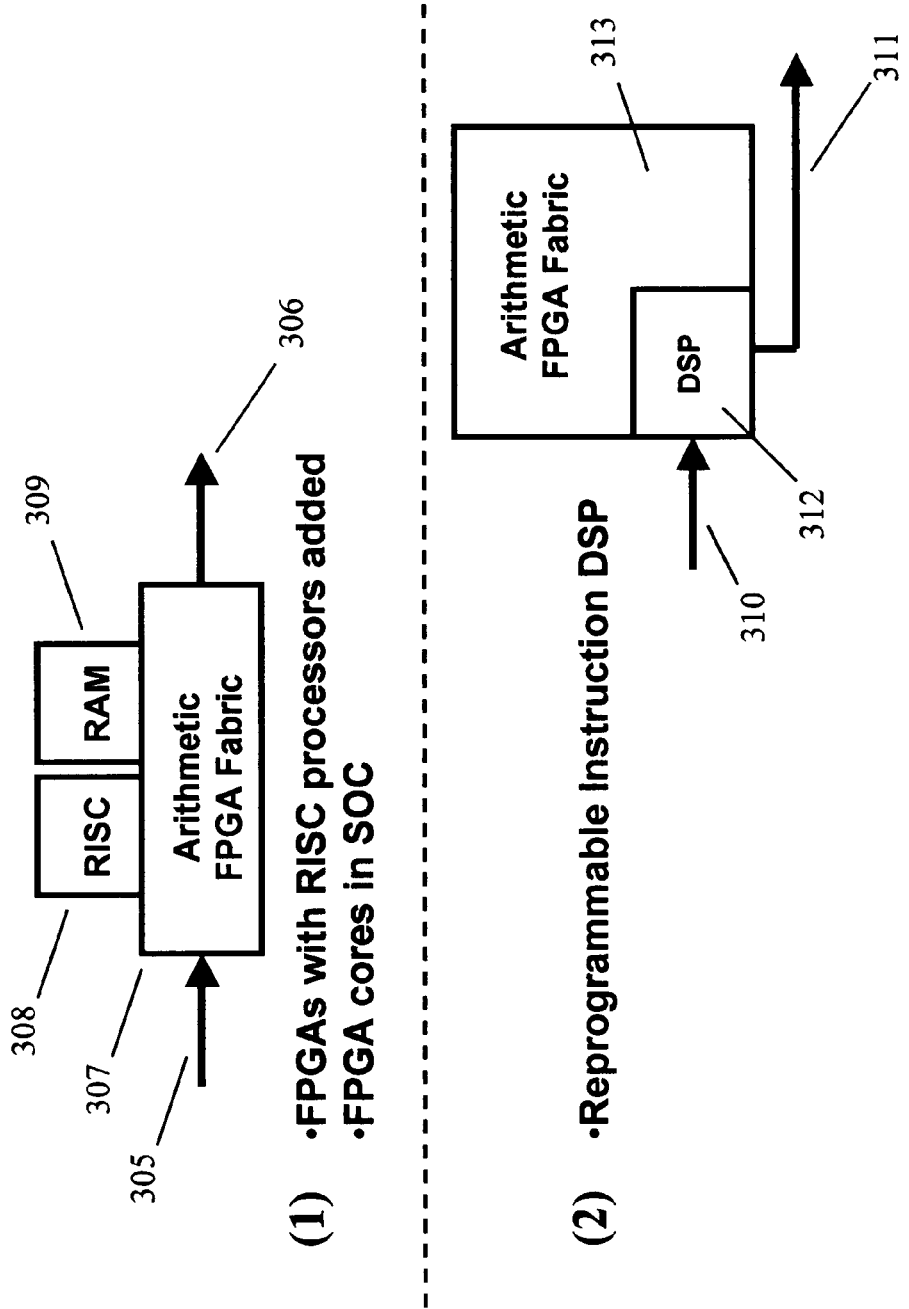

Types of FPGA Fabric

Heterogeneous FPGA Fabric:

Application-Specific FPGA Fabric:

REPROGRAMMABLE INSTRUCTION DSP

CROSS REFERENCE TO RELATED APPLICATIONS

This application claims benefit of U.S. Provisional Application No. 60/396,375, filed Jul. 17, 2002, and entitled "Reprogrammable Instruction DSP with Multi-Program FPGA Fabric", commonly assigned with the present invention and incorporated herein by reference.

FIELD OF THE INVENTION

This invention relates to the field of Digital Signal Processors (DSPs), and in particular, enhancements to software programmable DSPs that provide for reconfigureability of the instruction set after the device containing the DSP is shipped to the field, and provision for migrating designs to lower-cost volume production implementations.

BACKGROUND

Historically, DSP functionality has taken two forms: software programmable processors with arithmetically oriented instruction sets such as those offered by TI, Analog Devices, Motorola, and Agere (Lucent), and dedicated logic hardware functionality specifically performing arithmetic tasks. In recent years, an alternative approach to programmable DSP functionality has arisen where arrays of arithmetically oriented function modules are connected by reprogrammable routing resources, in a manner similar to that utilized in Field Programmable Gate Arrays (FPGAs), creating reprogrammable array DSP solutions. Reprogrammable array DSP solutions are being offered by companies like PACT, Leopard Logic, and Elixent as embeddable cores and by Chameleon as a discrete component. A core is an embeddable block of semiconductor functionality that can be included in a System-On-Chip (SOC) ASIC (Application Specific Integrated Circuit) design. These reprogrammable array DSP solutions always operate independently of any classical software programmable DSP architecture.

Meanwhile a different evolution in processor architecture has occurred for RISC (Reduced Instruction Set Computer) processors where synthesizeable processor cores are being offered by companies like ARC and Tensilica with the ability to customize instruction set extensions. Variations on these processors are also offered with multiplier-accumulator functions added enabling DSP applications to be better addressed. However, these processor cores are only customizable at the time the logic function is synthesized—which means some time prior to the construction of actual silicon. Their instruction set cannot be altered or reconfigured once the silicon implementation has been fabricated.

At the same time, it has been shown by companies such as ARC and Tensilica that the ability to create customized instructions can greatly improve the performance of a processor. Unfortunately, since these instructions are not alterable in the field (once the processor has been delivered to the customer) they cannot adapt to the surprises that arise when real-world phenomena are encountered upon powering-up the first prototype. Such discrepancies are even more prevalent for DSPs since they often deal with real-world phenomena like voice and video, and noisy communications mediums like cable modems, DSL, and wireless where unpredictability is inherent.

A research project summary presented at the Instat/MDR Embedded Processor Forum (Apr. 29, 2002) by Francesco Lertora, a System Architect at ST Microelectronics, had some similarities to the present invention. It was entitled "A Customized Processor for Face Recognition" and demonstrated a custom processor based on Tensilica's Xtensa processor core. Here, they coupled the configurable (not field programmable) instruction extensions of the Tensilica processor to a block of FPGA technology on a custom SOC design. To augment the Tensilica processor, they implemented arithmetic functions in the FPGA to perform DSP-type functions. In this example, the FPGA functionality not only performs operations where results are returned to the RISC processor, it also performs some I/O functions directly, essentially functioning at times as a coprocessor.

While not combining a conventional DSP with an FPGA fabric in a tightly-coupled and dedicated manner with the FPGA subordinate to the conventional DSP as embodied in the present invention, this demonstration by ST does reveal some of the benefits of a processor with re-programmable instructions since it was able to considerably accelerate the required functionality. However, ST's chip designers gave in to the temptation to allow the FPGA to perform functions independently. In general, this adds a substantial amount of hardware dependence to the design flow, making it far more difficult for designers to use. DSP designers typically prefer to design in a high-level language like C and not have to deal with hardware dependencies. As soon as the FPGA is allowed to execute tasks in parallel with the conventional software programmable DSP, the overall DSP program must be partitioned into parallel tasks, a complex issue involving intimate knowledge of the hardware.

Another company that has discussed FPGA fabric performing instruction is GateChange. However, the proposed architecture includes an ARM (RISC) processor and also allows the FPGA fabric full co-processing capability, with complete access to the device's I/Os—certainly not constraining the FPGA fabric to be fully subordinate to the DSP as in the present invention.

FPGAs have been used for years to construct dedicated DSP functionality, sometimes in conjunction with a conventional DSP but operating as a separate functional element. In recent years, some FPGA suppliers like Xilinx and Altera have added dedicated multiplier functions. These essentially create a heterogeneous fabric where most of the modules are conventional Look-Up Table (LUT) based programmable modules, and some are fixed multiplier functions. This has made these devices more effective in terms of performance and density when arithmetic (DSP) functions are performed in dedicated hardware. These same FPGA suppliers now also offer RISC processors embedded in their FPGA devices. However, their FPGA functionality is not constrained to be subordinate to the processor—in fact their paradigm is just the opposite, with the processor acting as an enhancement to the FPGA function.

In order to reduce cost in volume production, FPGAs are often converted (migrated) to mask-programmed ASIC devices. It is well known that when this conversion is done, it is common for numerous testing and timing problems to arise. These problems can make the conversion process take a very long time and sometimes also result in poor testability in the ASIC. One of the key reasons for these problems is the use of asynchronous functionality in the FPGA. When FPGAs having integral processors are converted to ASICs, a common source of conversion difficulty is the fact that the FPGA functions are not synchronously tied to the processor function and the processor's clocks. If they were, the conversion task would be much simpler and timely—in fact it could be made fully automatic.

It is a generally accepted fact that for conventional, software programmable DSPs, less than 10% of the code often accounts for more than 90% of the execution cycles. It therefore follows that if a software programmable DSP were created with a field-configurable (field-programmable) instruction set, where dedicated functions with a high degree of parallelism can be applied to perform the functions consuming 90% of the cycles, the overall processor performance could be increased significantly.

However, a software programmable DSP with a field programmable instruction set does not exist. It appears that when reprogrammable array DSP solutions are developed, the creators are determined that this technology alone is the solution to the problem and it should be used as a separate functional entity from the conventional software programmable DSP. As offered, reprogrammable array DSP solutions are used for all DSP functions including the large quantity of instructions that normally occupy only 10% of the execution cycles. Unfortunately, this focus ignores the paradigm that exists for DSP development and the fact that DSP programmers—who are typically software engineers with an expertise in math—prefer to work in a software environment without having to be concerned with hardware uniqueness. Reprogrammable array DSP solutions do not fit cleanly into the flow that DSP programmers prefer to use. A software programmable DSP with a field programmable instruction set, on the other hand, would fit well—and increase processor performance significantly at the same time.

Part of the historical vision of programmable hardware, which the aforementioned reprogrammable array DSP solutions are embodiment's of, is that the reprogrammable fabric can remain programmable in production. The theory is that this allows adaptability to future changes in functional requirements, even sometimes enabling changes "on-the-fly". Changes on-the-fly allow the personality of the logic to be altered from moment-to-moment as different algorithms are required for different tasks, sometimes altering the personality in as little as a clock or two. Unfortunately, the FPGA fabric used in these solutions consumes between 20 and 40 times as much silicon area as the standard-cell ASIC implementations normally used in SOC design. Further, if it is desirable to alter the function of the FPGA fabric on-the-fly and within a clock cycle or two, additional configuration memory must be included in the FPGA fabric to implement a "multi-program" capability, increasing the consumption of silicon area even more. Today, it remains to be seen if the value of full reprogrammability is economically viable for SOC-class designs, even more so the value of multi-program implementations.

Eventually, given the realities for very deep submicron design and the eventuality forecast by some that Moore's law (for semiconductor density and performance over time) may break down in the future, it is possible that fully-programmable multi-program FPGA fabrics may become viable for SOC volume production. However, in the meantime, there is a need for solutions that take advantage of flexibility benefits of FPGA technology, while also providing an effective and practical solution for volume production.

SUMMARY

A software programmable DSP with a field programmable instruction set is described where customized instructions can be created, or certain existing instructions can be modified, at the user's location after taking delivery of the processor. The FPGA fabric used to implement the reprogrammable instructions is restricted to supporting the software-programmable DSP—never functioning as an independent coprocessor—and therefore enabling the reprogrammable instructions to exist in the normal stream of DSP software execution. DSP-type functions implemented in the FPGA fabric are also automatically generated such that they are synchronous with the processor clocks—enabling easy conversion to an ASIC. Reprogrammable Instruction DSPs (rDSPs) can be supplied as individual discrete devices, or alternately supplied as Intellectual Property core functions for inclusion in a System On Chip (SOC) ASIC design.

Alternative architectures are shown for implementing the reprogrammable portion of the processor, including homogeneous, heterogeneous, and application-specific arrays of FPGA-style function modules and associated programmable interconnect. A method for creating instruction sets optimized for different applications is disclosed. Designs implemented on a die containing a DSP with an FPGA-style reprogrammable instruction fabric may also be migrated to a smaller die within a family of DSP die containing hard-wired ASIC instruction fabrics.

Multi-program FPGA functionalities may also be migrated to smaller die by constructing ASIC implementations that retain the multi-program capability. The described multi-program capability can be used to create instruction set extensions for a conventional software programmable DSP, or alternately, used separately to implement a multi-program, reprogrammable array DSP that can be migrated to a smaller die while retaining multi-program capability.

BRIEF DESCRIPTION OF THE DRAWINGS

The present invention is described with respect to particular exemplary embodiments thereof and reference is accordingly made to the drawings in which:

FIG. 3a shows how the architectural paradigm for rDSPs compares with that of conventional FPGA devices, as well as FPFA fabrics used as IP cores within SOC designs.

DETAILED DESCRIPTION OF THE INVENTION

Figure 1:
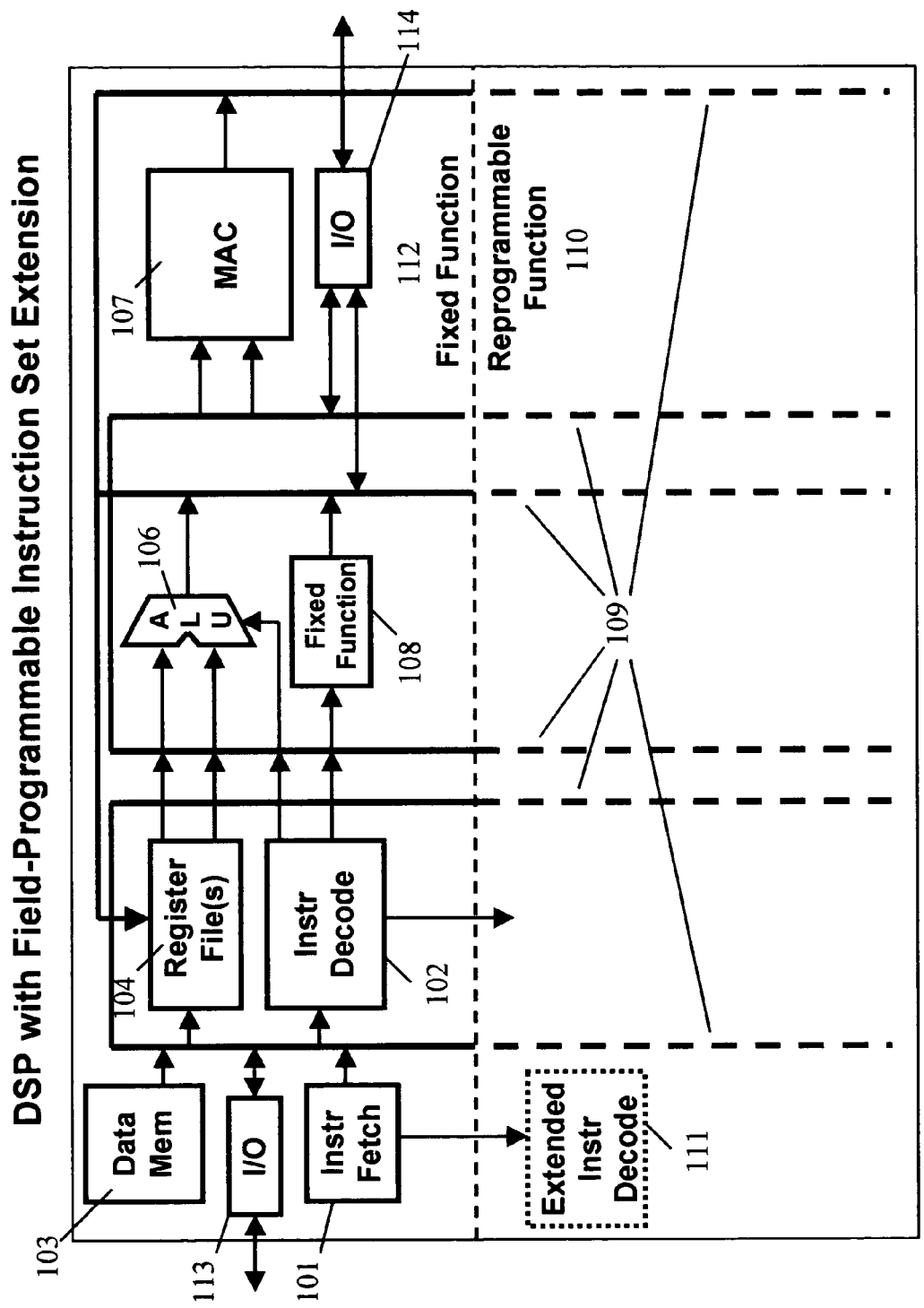
FIG. 1 shows a block diagram for a DSP having field-reprogrammable extensions to its instruction set.

The basic concept showing the instruction set of a DSP being expanded to include instruction functionality that can be reprogrammed in the field is shown in FIG. 1. Here, a simple DSP architecture resides in a fixed function implementation and includes instruction fetch 101, instruction decode 102, data memory 103, register files 104, ALU 106, MAC 107, and other miscellaneous fixed functions 108. Various busses 109 connect from the fixed function area of the processor 112 into the reprogrammable function area 110 as shown. In addition, provision is made for the extension of the instruction decode into the reprogrammable area by way of extended instruction decode 111. Also, instruction decode 102 can provide additional control signals for use in reprogrammable function 110.

Note especially that reprogrammable function 110 is strictly subordinate to the conventional fixed-function (software-programmable only) DSP function 112. All I/O functions 113 and 114 are done through the structure of DSP function 112. This distinction is important as all prior art examples combining processors and reprogrammable logic (FPGA) function, allow the FPGA to operate independently of the conventional DSP processor, often including communication directly with I/O independent of the software flow. This parallelism and/or coprocessing adds a complexity to the overall design flow that becomes a barrier to adoption, especially since most DSP users today are software engineers with math degrees—not electrical engineers. It is therefore critical for ease-of-use that operations performed by reprogrammable function 114 remain within the sequence of execution prescribed by the DSP software program being executed. If the execution time for a particular FPGA function requires multiple clock cycles for execution, the DSP will wait for the results before proceeding. Normal house-keeping functions (cache management, pre-fetch, pipeline movement) may continue, but relative to the programmed instruction flow, the DSP will essentially be in a "wait-state" while the FPGA performs its function.

The above restriction is therefore unique in providing an overall solution where the FPGA fabric executes functions that replace normal software subroutines, without disturbing the flow of the DSP software program. If the reprogrammable fabric (FPGA) is allowed to execute functions independently and therefor concurrently, the programming sequence will be significantly complicated, becoming a deterrent to adoption of the technology by DSP engineers who today, use only conventional, software programmable DSP devices.

Figure 2:
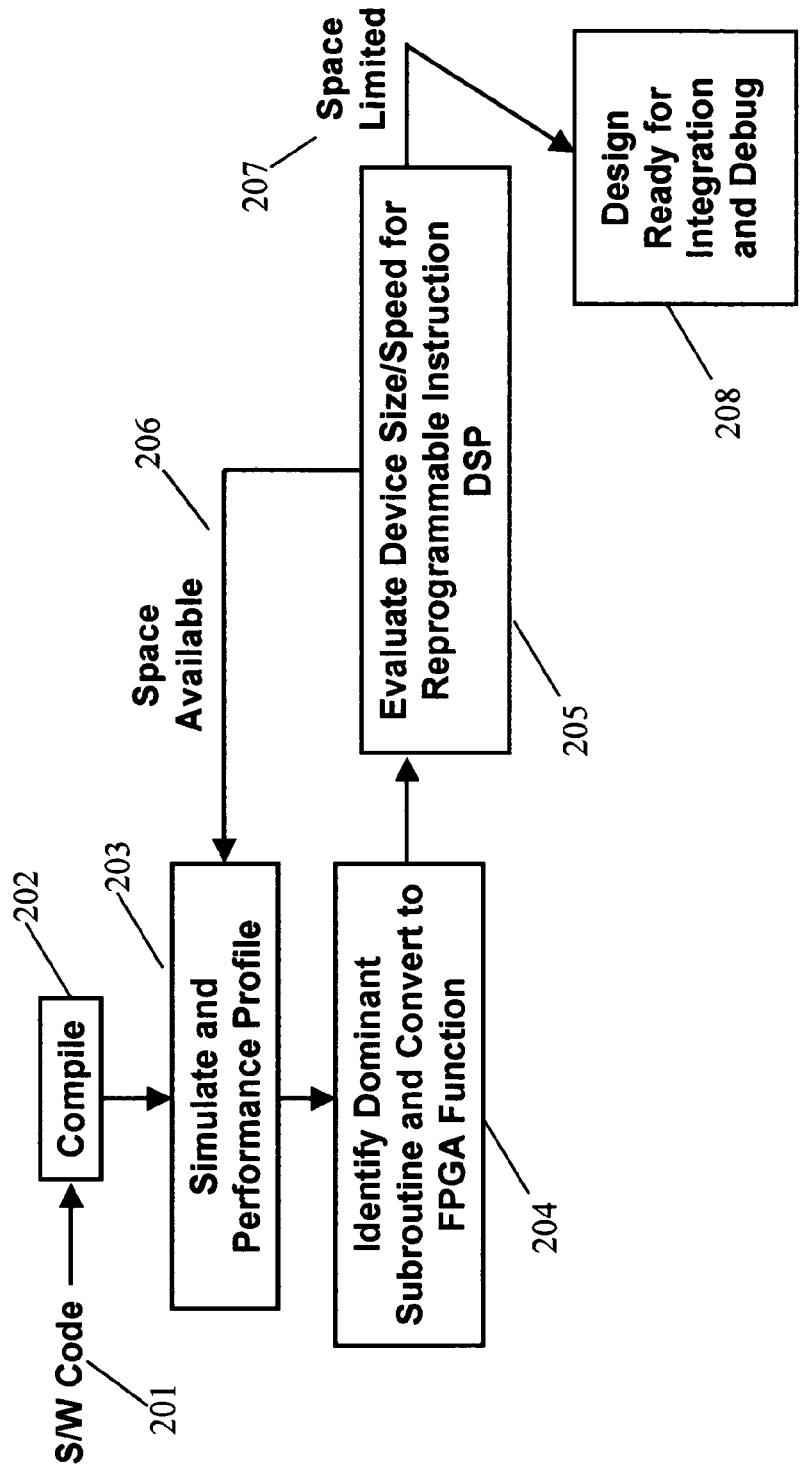
FIG. 2 shows a flow-chart for the development process using reprogrammable instruction DSPs.

FIG. 2 shows the design flow for a Reprogrammable Instruction DSP (rDSP). First, software code 201 is compiled 202 and then goes to a process of simulation and performance profiling 203. Then, as a result of profiling and determining which subroutines are dominating the processor's execution time, that subroutine which consumes the largest percentage of processor run time is isolated and converted 204 to FPGA functionality for implementation in the reprogrammable function area of the rDSP. DSP-type functions implemented in the FPGA fabric may be automatically generated such that they are implemented in synchronous logic and are also synchronous with the processor clocks—enabling easy conversion to an ASIC. Without restricting the FPGA functionality to be synchronous logic and also synchronous with the processor clocks, numerous timing and testability problems can arise in later converting the design to an ASIC. If the netlist for the FPGA function is generated entirely by machine from the subroutines previously identified and isolated as dominating the processor's execution time, then there is no problem in converting to an ASIC. This restriction is unique since heretofore, FPGA designers can always create whatever logic function they want, synchronous or not.

Next, the overall performance of the DSP, including both software-programmable conventional DSP function and the reprogrammable FPGA function is evaluated 205. Simultaneously, evaluation step 205 also includes a comparison of the (silicon area) size required for the reprogrammable function relative to the reprogrammable area available in the various members of the rDSP family. If there is significant space still available in the family member that currently can contain the FPGA functionality defined so far, the process of profiling and converting will continue 206. Simulation and performance profiling 203 will be performed again, followed by subroutine identification and conversion 204, and then further size and speed evaluation 205. Finally, when the performance requirement has been met, and/or the current member of the rDSP family containing the FPGA functionality has limited space 207 to add additional functionality, the overall rDSP design is declared ready for implementation, integration, and debug 208. Of course, if the performance requirement has not been met, the user can decide to target the design at the next larger rDSP in the family, thereby making more space available for FPGA-based instruction functionality and allowing the profiling and conversion process to continue further.

Figure 3:
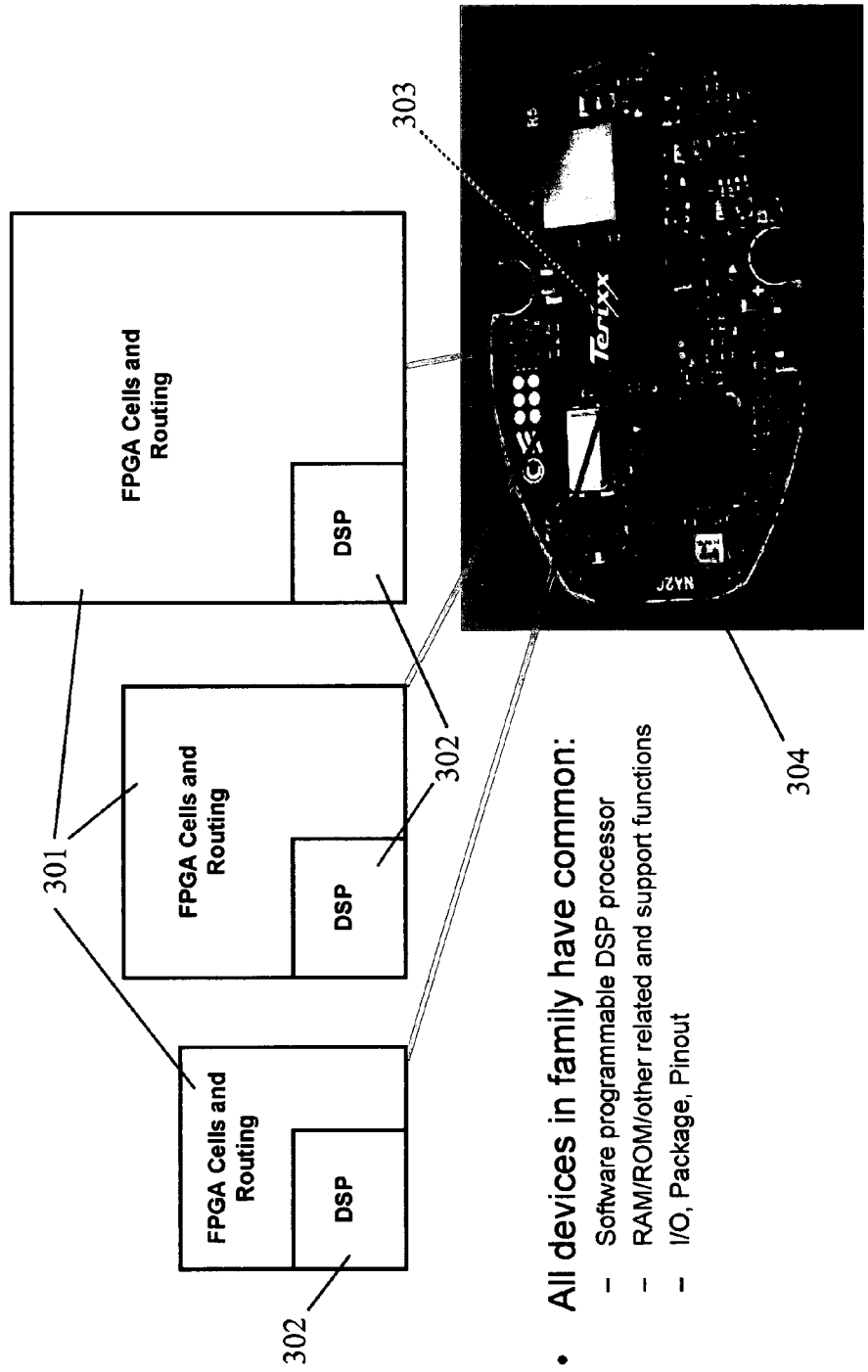
FIG. 3 shows how a family of reprogrammable instruction DSPs, with different amounts for FPGA fabric, can function identically in the same application.

An example of a family of rDSPs is shown in FIG. 3. Here, three devices are shown, each containing identical conventional DSP functionality 302 including supporting functions like timers, RAM and ROM. The primary difference between the three members of the family shown occurs in the amount of FPGA fabric 301 included. Otherwise, all members within a given family of rDSPs are identical. Execution time for the conventional DSP functionality 302 will be the same across the family. However, the overall performance of a given device will be affected by the longest critical path in the FPGA functionality.

All devices in the family also have identical I/O functionality and are therefore capable of plugging into the same socket 303 in user system 304. Note that since the rDSP is first and foremost a DSP, the rDSP I/O functions are like that of conventional software programmable DSPs such as those manufactured by TI, Agere, Motorola, and Analog Devices. In fact, the exact I/O pinout (function and pin number assignment) configuration may be identical to a popular, high-performance DSP, such as the TMS320C64 series from TI. I/Os for rDSPs are not general-purpose, multi-standard I/Os such as those found on FPGAs. rDSP I/O functions can be smaller and simpler than typical FPGA I/Os since they are targeted specifically for applications normally performed by conventional DSPs.

FIG. 3a shows how the architectural paradigm for rDSPs (diagram 2) varies from the typical architectural arrangement for FPGA devices and FPGA fabrics used in SOC (diagram 1). In diagram 1 of FIG. 3a, I/Os 305 and 306 are tied directly to the FPGA fabric and not to a RISC processor 308 or RAM 309 that may also be attached. Here, the FPGA is the central focus. In contrast to this, diagram (2) shows how I/Os 310 and 311 for the rDSP are connected to the conventional software programmable DSP 312, and not to the FPGA fabric 313. This supports the paradigm where the rDSP is the master with the FPGA fabric subordinate to the DSP.

Figure 4:
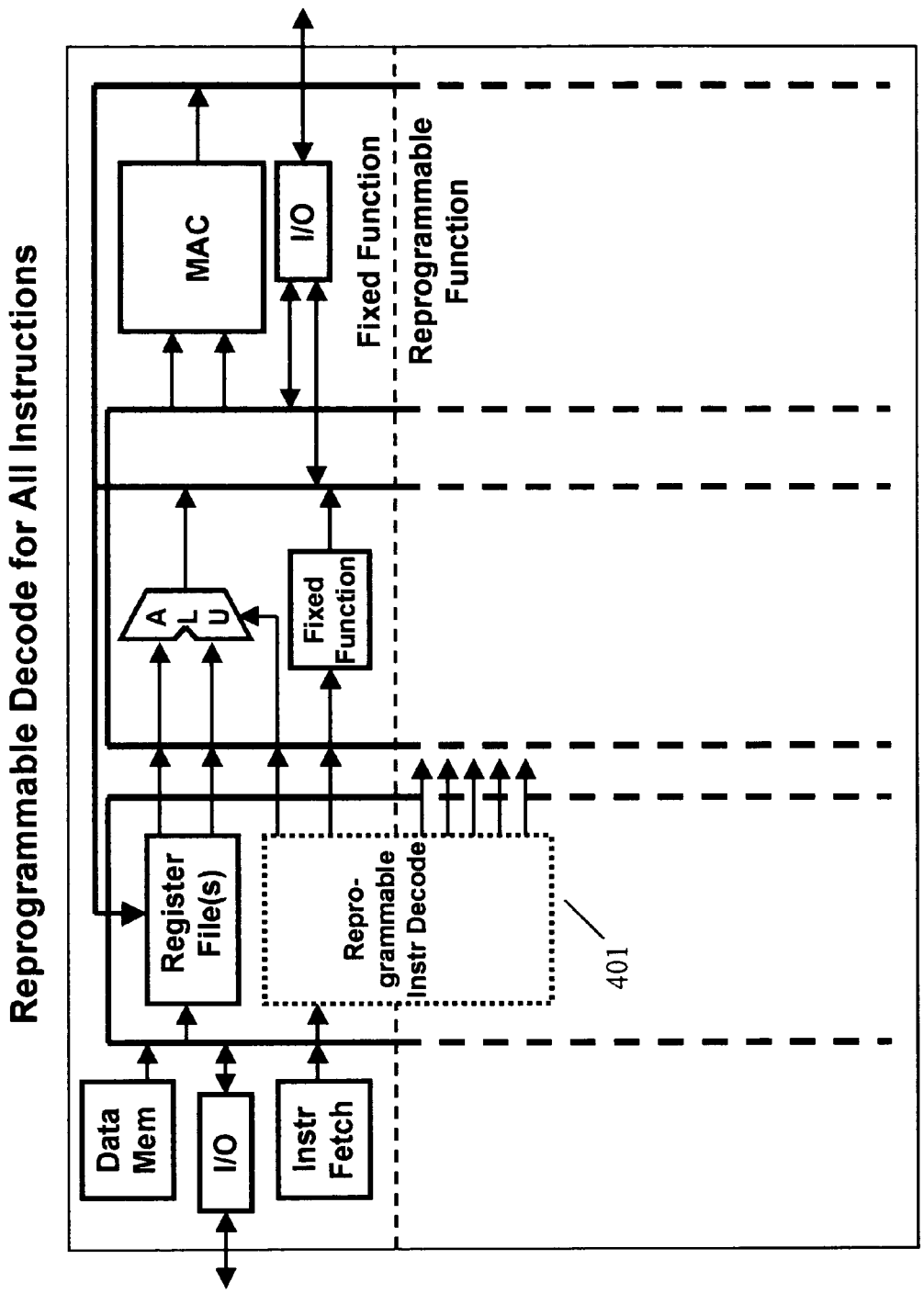
FIG. 4 shows a block diagram for a DSP having a reprogrammable instruction set including a reprogrammable instruction decode and controller block.

An alternative implementation for the instruction decode mechanism of FIG. 1 is shown in FIG. 4 where reprogrammable instruction decode block 401 performs instruction decode for the entire DSP including functions located within the fixed function area. This allows the operation of fixed functions to be coordinated with the operation of reprogrammable functions in order to maximize utilization of all available functions once the reprogrammable instructions have been defined.

Figure 5:
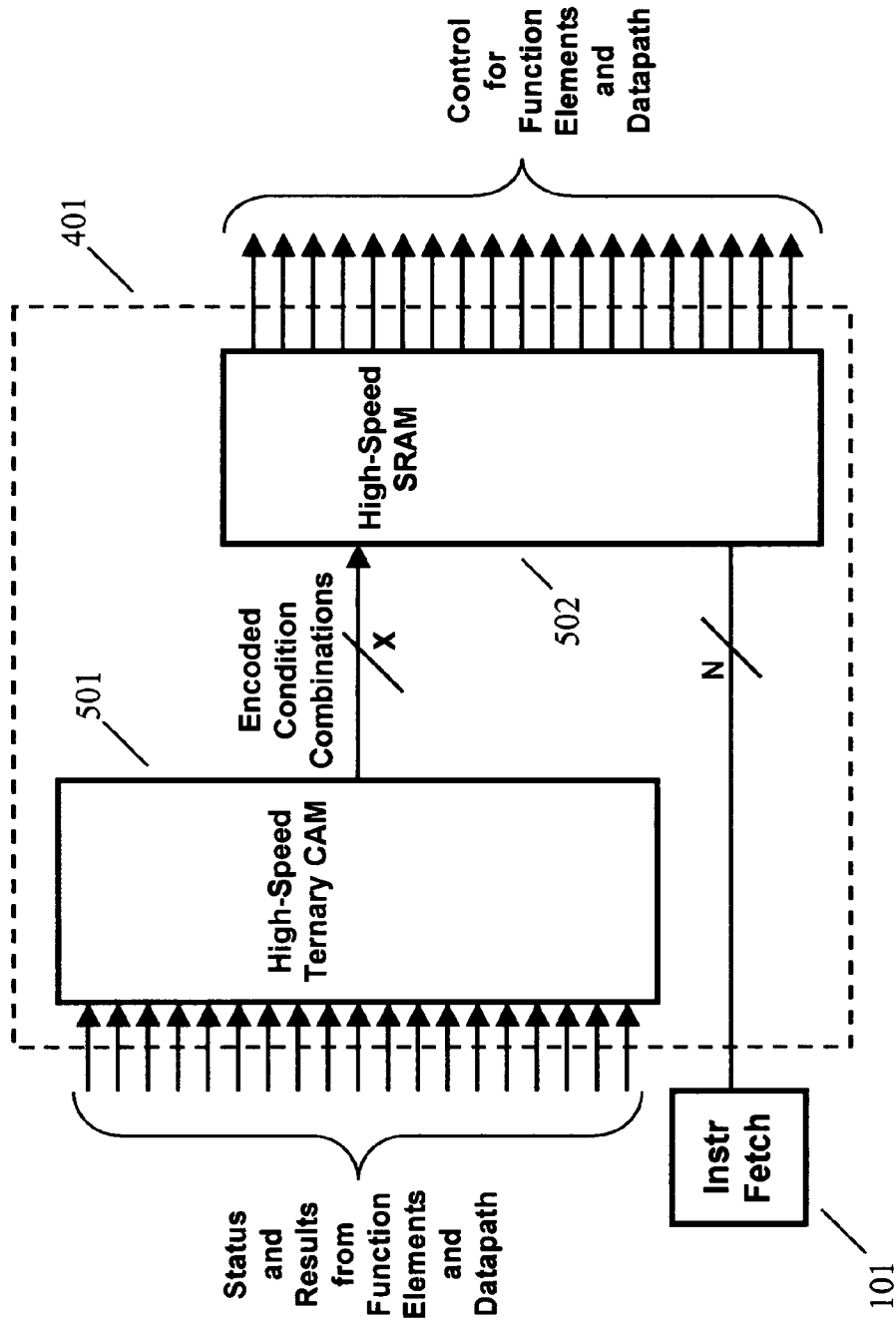
FIG. 5 shows a possible implementation for the reprogrammable instruction decoder and controller of FIG. 4.

A more detailed view of one particular implementation of reprogrammable instruction decode block 401 of FIG. 4 is shown in FIG. 5. In this unique implementation, a high-speed ternary CAM 501 (Content Addressable Memory) is used to decode status and results signals coming from the various function elements and data path elements that exist within the processor. Here, unique combinations of these status and results signals are detected and subsequently encoded in the X bits that comprise the outputs of the CAM. The outputs of CAM 501 are connected to some of the address inputs of high-speed SRAM 502. The other address inputs of high-speed SRAM 502 are connected to the stream of instructions coming from instruction fetch unit 101. Note that the instruction stream from fetch unit 101 is already encoded and therefore works well when connected to the address inputs of a conventional memory such as SRAM 502. Also note that any data paths necessary to load (initialize) CAM 501 or SRAM 502 are not shown here for the sake of simplicity.

Ternary CAM 501 provides the capability of decoding a relatively small number of conditions from a large field of bits, and then creating an encoded representation of each input condition. SRAM 502 possesses the capability of producing any combination of output values for all possible combinations of inputs. The unique combination of ternary CAM 501 feeding high-speed SRAM 502 provides a maximum degree of flexibility and re-programmability with a minimal use of silicon area while retaining reasonably fast performance. Although not shown in FIG. 5, a pipeline register may be placed between CAM 501 and SRAM 502 if it is appropriate given the overall timing scheme within the processor.

Figure 6:
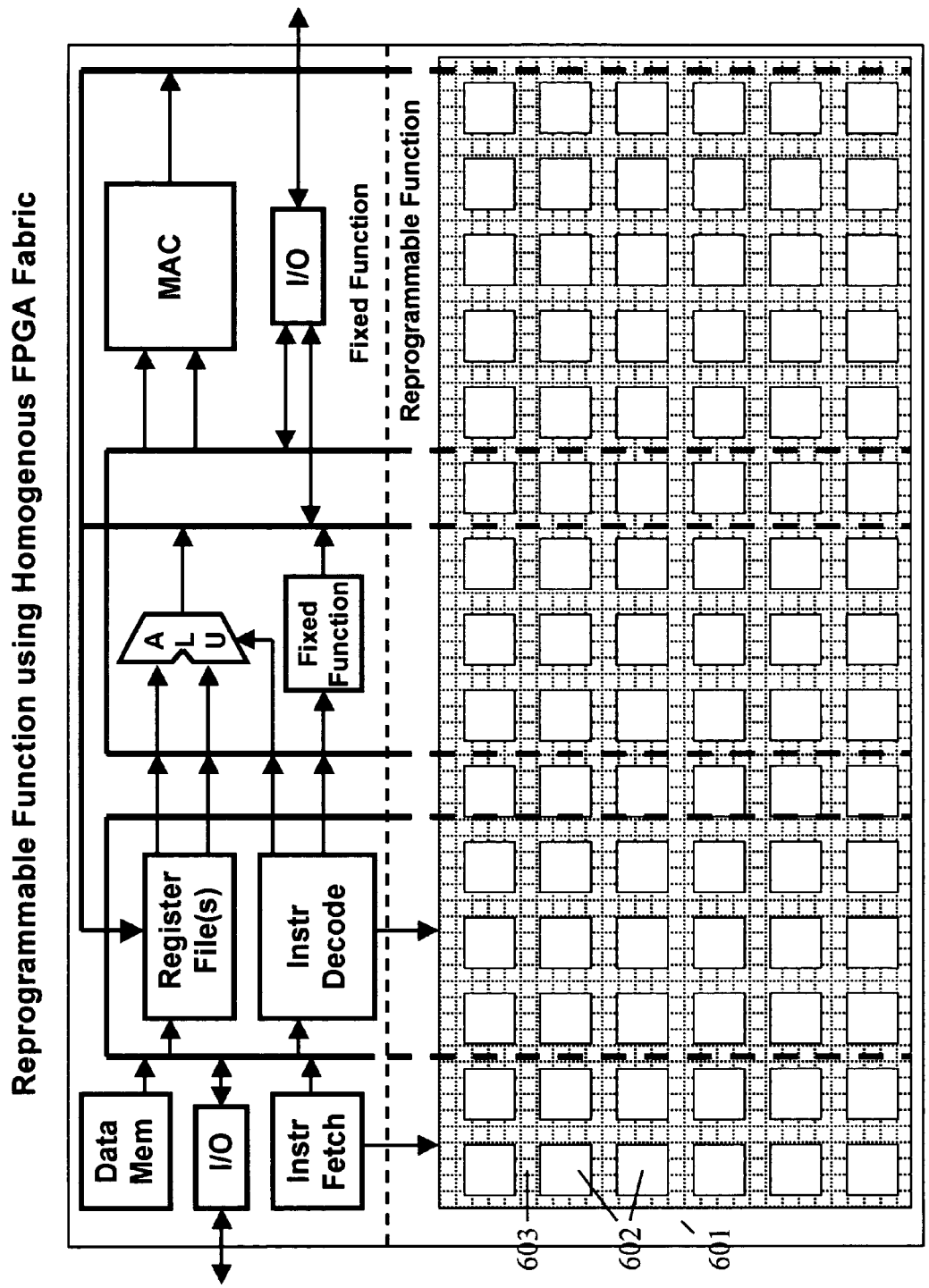
FIG. 6 shows how reprogrammable instructions can be implemented using a homogeneous FPGA fabric.

FIG. 6 shows a DSP including an area of reprogrammable function for constructing reprogrammable instruction execution functionality. Note that, as mentioned earlier, a "reprogrammable instruction" is a function implemented in the FPGA fabric (possibly working in conjunction with functionality in the fixed conventional DSP processor) that typically replaces a subroutine, or string of instructions, that would otherwise be executed by the conventional, software-programmable DSP. To implement a reprogrammable instruction according to FIG. 6, the re-programmable function is implemented in a homogeneous FPGA fabric 601 where all reprogrammable function modules 602 are the same. Usually, an FPGA function module contains a cell for generating combinational logic function and some type of flip-flop or latch that can either be used when needed for storage, or alternately bypassed when not needed.

FPGA function modules are typically connected together with a matrix 603 of reprogrammable switches and routing wires, sometimes mixed with muxes, and controlled by reprogrammable memory cells. Such FPGA architectures are well known in the art and are contained in devices manufactured by Xilinx, Altera, and others. In some FPGA architectures, the function modules themselves can be programmed to implement one of a number of possible logic functions. For FPGAs typically manufactured by Xilinx and Altera, this is implemented with RAM/Mux-based Look-Up Tables (LUTs). Other FPGA architectures exist where the function modules themselves may not be programmable—variations in combinational logic functionality are instead obtained by the manner in which signals are connected to the modules. For these architectures—basically consisting of arrays of muxes—any logic function can be achieved according to how the muxes are connected together. Regardless of the particular module type chosen, a homogeneous array has identical cells (each typically capable of combinational and sequential function), repeated across the array. A homogeneous array is the most regular and therefore the easiest to support with automatic placement and routing software. However, since the modules are the most general purpose, the array they comprise will typically consume the most silicon area and have the lowest performance.

Figure 7:
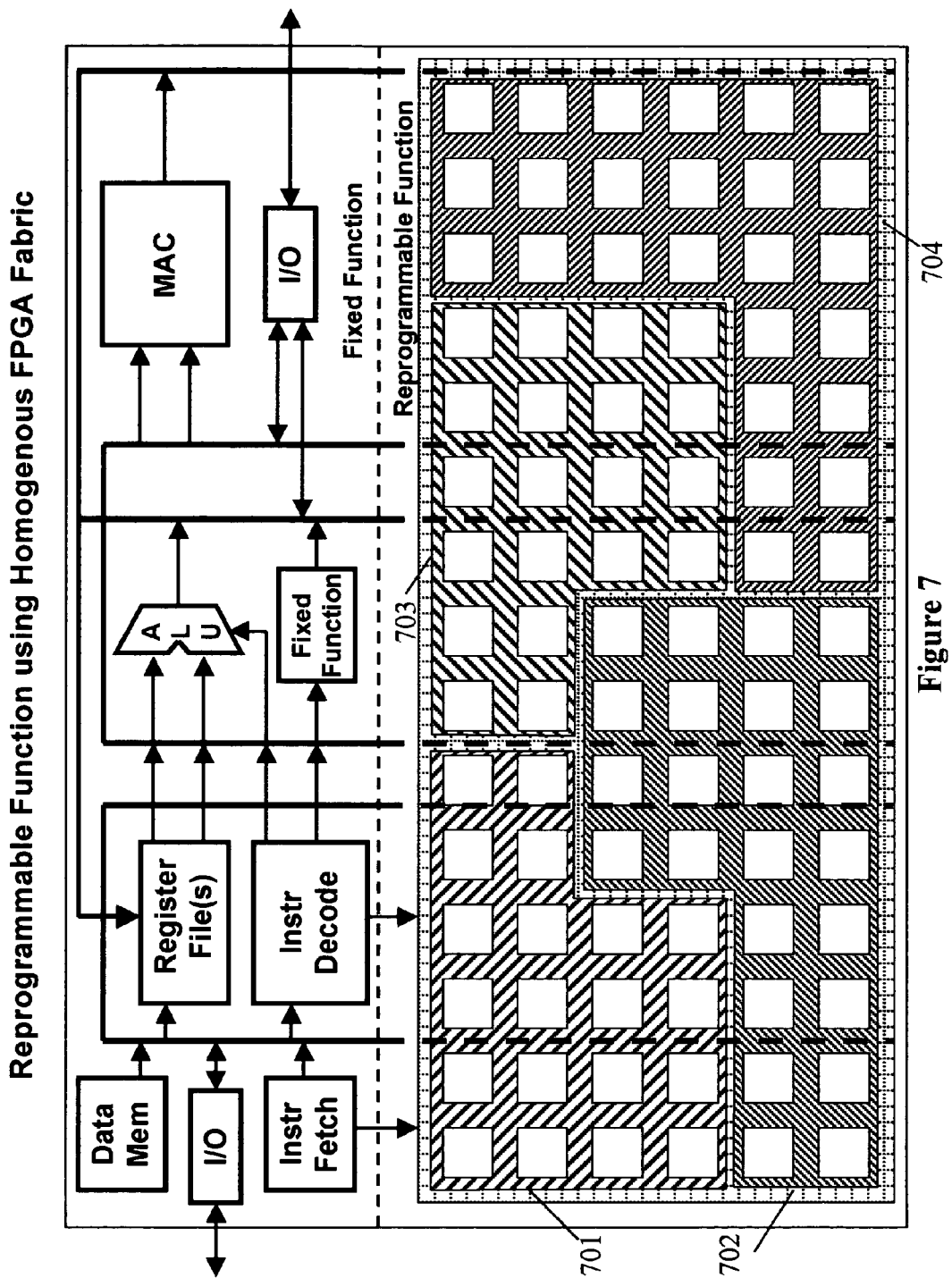
FIG. 7 shows how four reprogrammable instructions are implemented using the FPGA fabric of FIG. 6 where each of the four requires approximately the same amount of hardware function.

FIG. 7 shows the DSP architecture of FIG. 6 where four different re-configurable instructions have been constructed by allocating approximately equal areas (701, 702, 703, and 704) of the FPGA fabric. Although it is not likely that such relatively equal areas would be used, this example is meant to show the contrast with FIG. 8 where a significantly larger amount of silicon area is allocated to instruction 801 than is allocated to instruction 802. Note that although not shown here, the areas that comprise functionality for different instructions may overlap.

Note that it is also possible to share the FPGA fabric among multiple instructions. This is made possible by the operation of the programmable instruction decode and control function (if present) that can be programmed to utilize various functions formed from the FPGA fabric to participate in the execution of more than one instruction.

Figure 8:
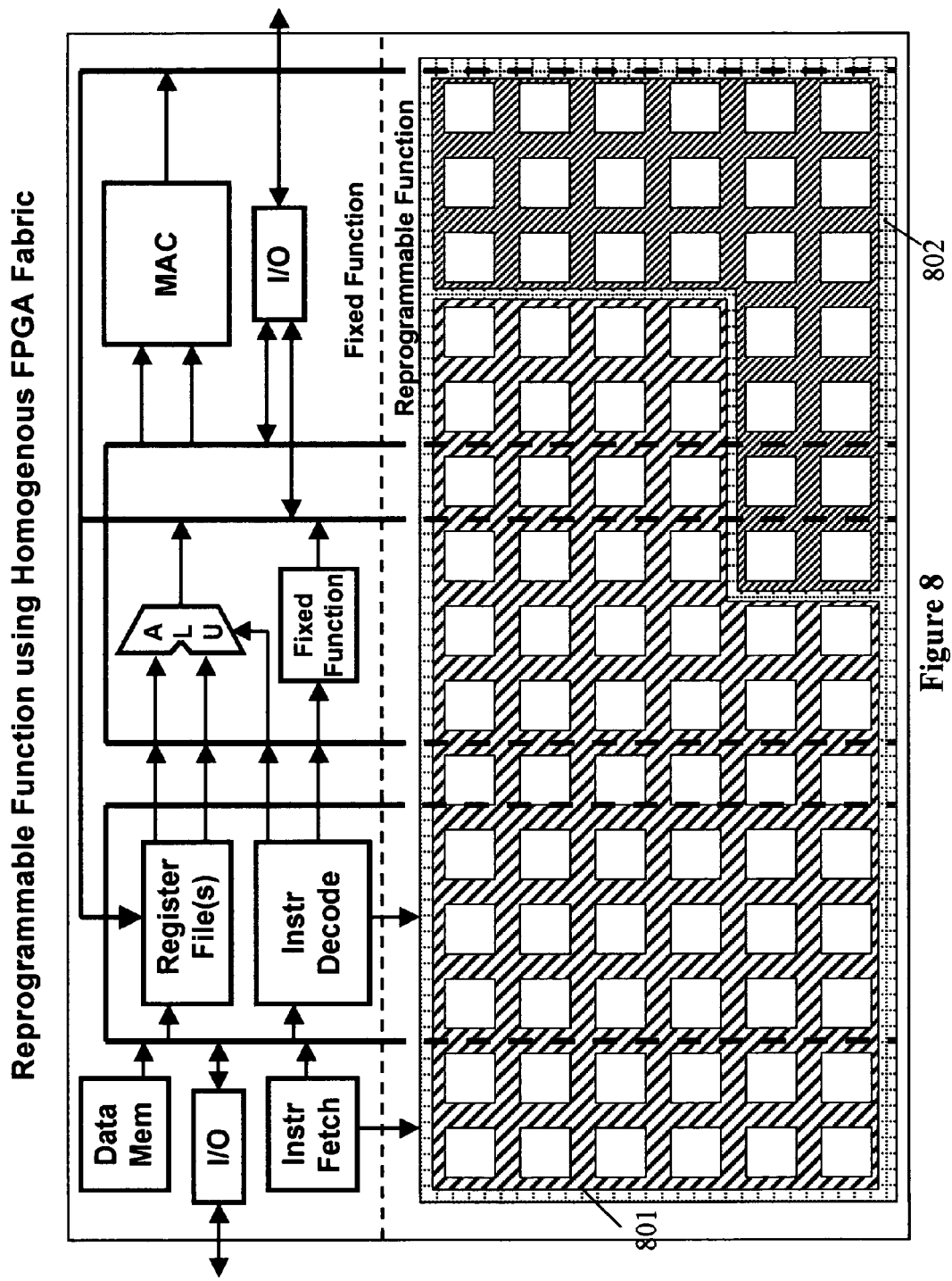
FIG. 8 shows how two reprogrammable instructions are implemented using the FPGA fabric of FIG. 6 where one of the two requires a significantly larger amount of hardware function.
Figure 9:
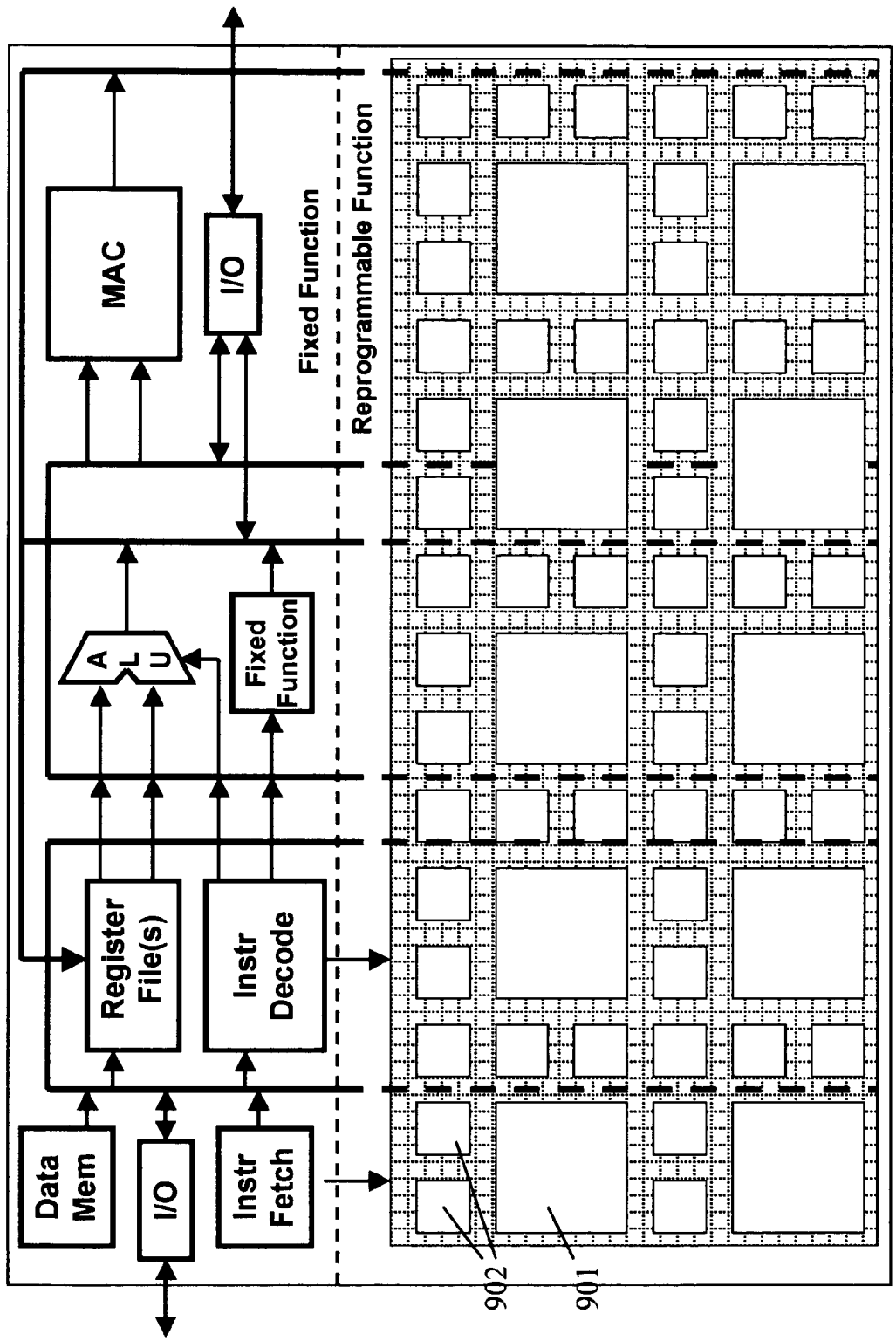
FIG. 9 shows a block diagram for DSP and where reprogrammable instructions are implemented using a heterogeneous FPGA fabric where function modules of different sizes are mixed together in a regular pattern.

FIG. 9 shows an alternative architecture where the reprogrammable instruction functionality is implemented with a heterogeneous FPGA fabric. This fabric, like that of FIGS. 7 and 8 is still general purpose, but has a mixture of function modules having different amounts and/or styles of logic. Notice that module 901 is shown significantly larger than module 902. There could be a number of reasons for this size difference depending on the strategy that has been chosen for the architecture definition. This difference could be the result of module 901 containing a larger LUT or Mux than module 902, or even a larger number of LUTs or Multiplexers (if multiple numbers of LUTs or Multiplexers are used per module). The difference between 901 and 902 could also be due to 901 containing more arithmetic functionality, since many DSP instructions are of an arithmetic nature. Regarding arithmetic functions, module 901 could also contain a multiplier, a multiplier accumulator (MAC), or a MAC where the accumulator can be bypassed if only the multiplier is required.

While the FPGA fabric of FIG. 9 is shown with a specific ratio of large grain to small grain FPGA logic modules, the ratio may vary as required by different classes of application, or alternately, the best overall ratio for all DSP applications may be a different number. For instance, if the larger module 901 contains a multiplier, it may be best to have a larger number of small modules 902 for every large module 901.

Alternately, it may be appropriate to have a mix of module sizes where there are 3 or more specific types, repeated at regular intervals in some ratio. Types that might be mixed together could include Multipliers, Adders, Registers, Programmable Logic Modules (LUTs or MUXs), and ALUs, for example.

Even though the logic module resources in FIG. 9 are of varying types, they are still arranged in a regular pattern. This means that automatic placement software, while still having some difficulty due to the difference in module size and function, will still benefit due to the regularity that remains.

Figure 10:
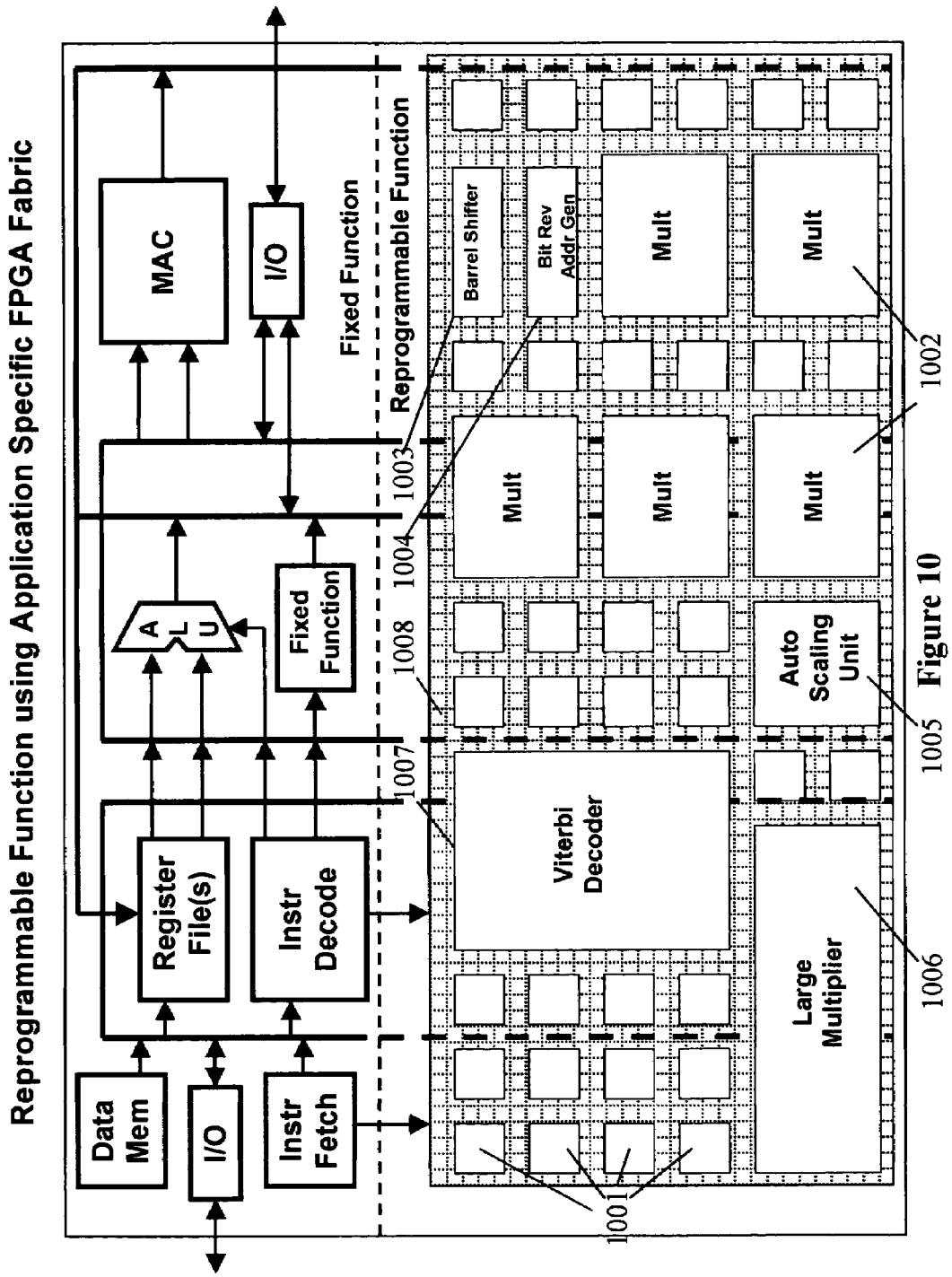
FIG. 10 shows a block diagram for DSP and where reprogrammable instructions are implemented using a heterogeneous FPGA fabric where purpose-built application-specific DSP function modules of irregular sizes are mixed together in an irregular pattern.

FIG. 10 shows a variation on a heterogeneous FPGA fabric where function blocks containing circuit types specific to DSP tasks are included, replacing some of the more general-purpose functions 1001. Modules 1001 are similar to those found in typical FPGA fabrics. The "application-specific" DSP blocks might include functions such as Multipliers 1002, Barrel Shifter 1003, Bit-Reverse Address Generator 1004, Auto-Scaling Unit 1005, Large Multiplier 1006, and Viterbi Decoder 1007.

As with FIGS. 6 through 9, function modules in FIG. 10 are connected with reprogrammable routing 1008, typically consisting of predetermined wiring structures connected together with reprogrammable switches. Even though the irregular selection of functions shown in FIG. 10 provides a significant challenge for automatic placement software, the increased speed and density made possible by such optimized functions can be more than worth the trouble. This is especially true if an instruction sequence in a real application heavily utilizes these application specific functions and, as a result, experiences a significant performance increase.

Figure 11A:
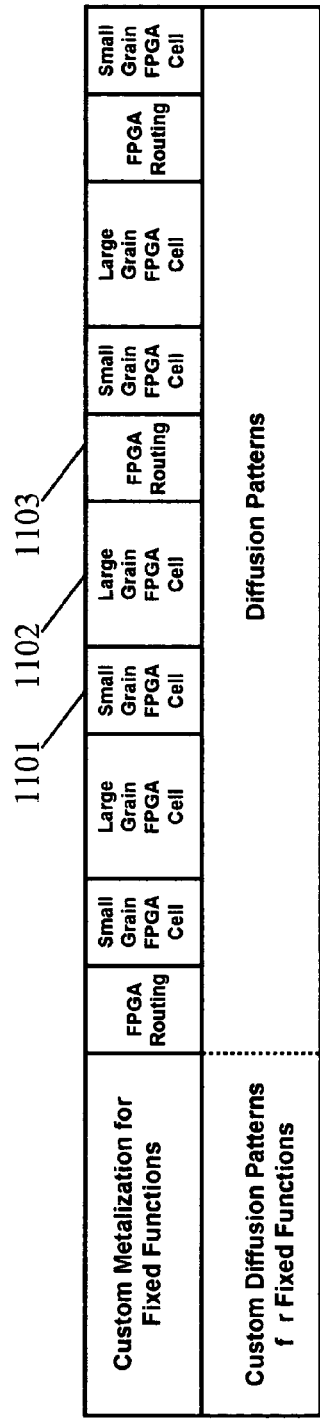
FIG. 11a shows a cross-section diagram where the functions implementing reprogrammable DSP instructions are constructed using a heterogeneous FPGA fabric.
Figure 11B:
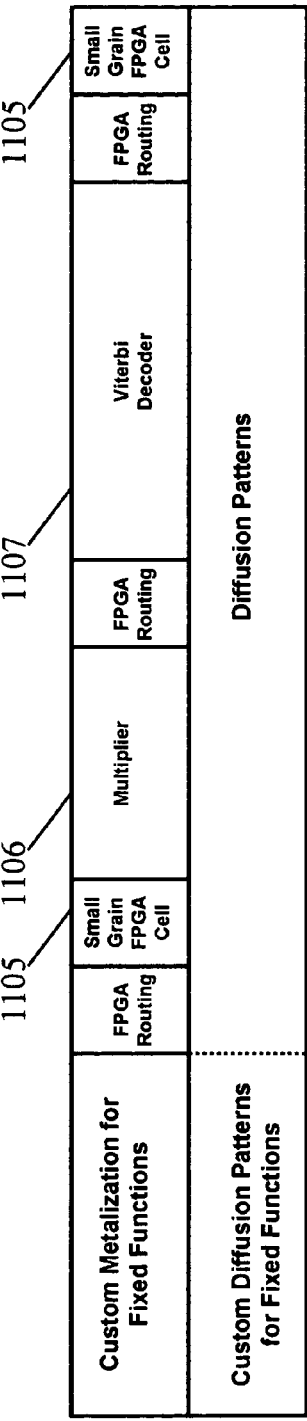
FIG. 11b shows a cross-section diagram where the functions implementing reprogrammable DSP instructions are constructed using an application-specific FPGA fabric.
Figure 14:
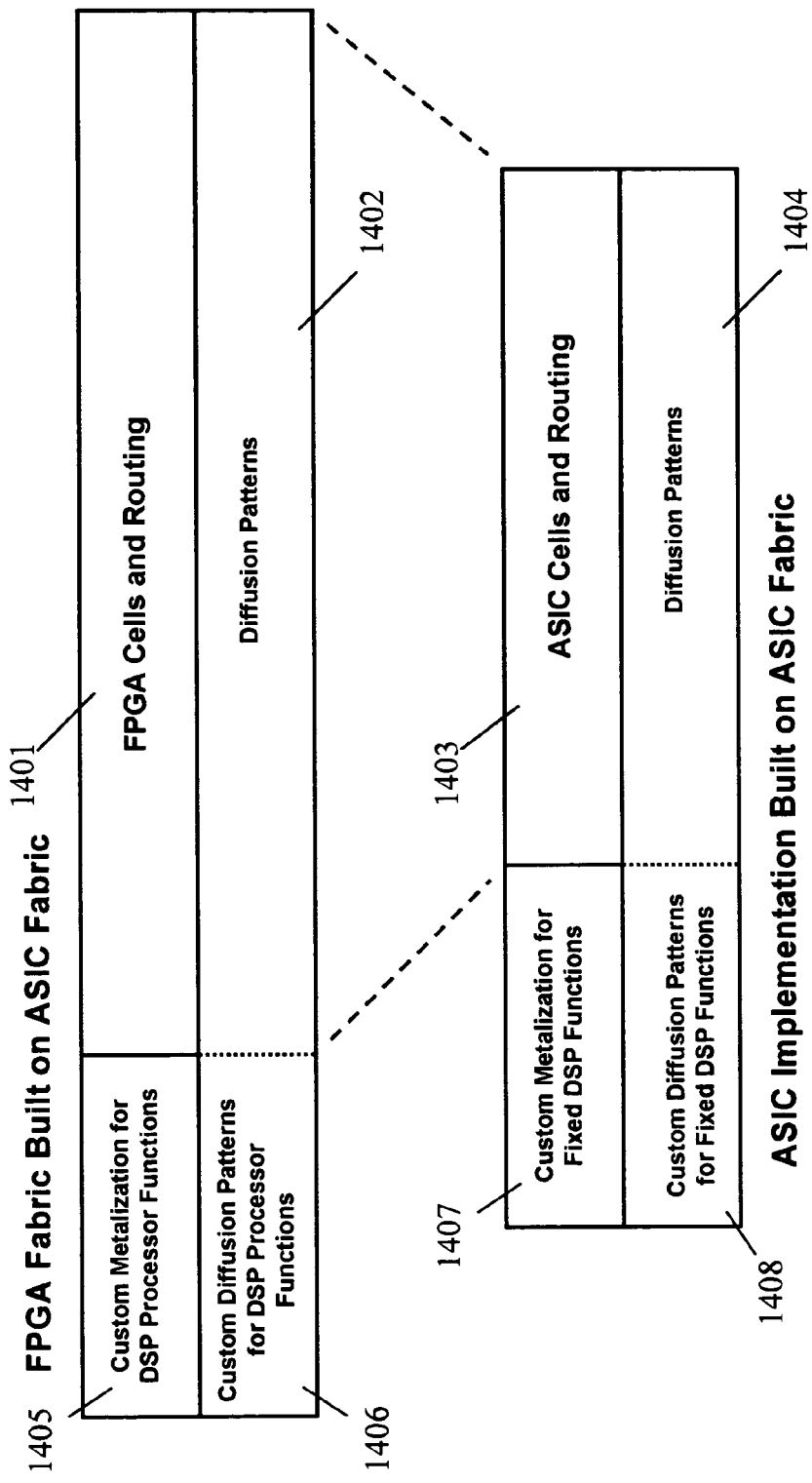
FIG. 14 shows the concept of first implementing a reprogrammable instruction DSP on a semiconductor die using an FPGA fabric, and then migrating that design to a different (smaller) die where the functionality originally implemented in the FPGA fabric is instead implemented in ASIC technology.

FIGS. 11a and 11b shows a cross-section of the FPGA fabrics of FIGS. 6 through 10. Diffusion patterns 1104 will normally be customized for the particular FPGA fabric shown, or in an alternate embodiment, can be constructed in a semi-custom manner. In the semi-custom approach, the particular FPGA fabric would be constructed on top of an ASIC-type fabric where a suitable array of transistor patterns are created in the diffusion layers of the device in the area where reprogrammable function is desired. The transistors in this ASIC-type fabric may all be the same, or may be a mix of different sizes and characteristics, depending on what is most suitable for constructing the FPGA fabric that will be constructed upon it. When this semi-custom approach is used, transistor patterns are diffused and the wafer is manufactured up to, but not including the point where polysilicon is applied. This difference from conventional ASICs (where wafers are prefabricated up to at least first layer metal) is due to the requirement in RAM-based FPGAs for making some short connections using polysilicon material for routing. Thus, the polysilicon layer must also have a custom pattern for each style of FPGA fabric that is constructed on the uncommitted transistor diffusion fabric. Since much of an FPGA fabric consists of RAM, it may be especially useful if the base array of ASIC transistors is designed primarily for building RAM, but can also be used for building logic. Thus, when RAM is needed for FPGA configuration, it will be efficiently constructed. In addition, RAM is almost always needed for user RAM in an actual application circuit, and the ability for the base ASIC pattern to build RAM is also especially useful for FPGAs, and also useful if the final device is instead constructed as a mask-programmed ASIC on the base ASIC fabric as shown in FIG. 14.

In FIG. 11a, if a semi-custom approach is desired, the diffusion patterns for (un-committed) ASIC transistors 1104 are created under the area where reprogrammable instruction functionality is desired. Then, an FPGA fabric, in this case a heterogeneous fabric consisting of large grain Cells 1102, small grain cells 1101, and FPGA reprogrammable routing functionality 1103 are constructed according to how the polysilicon and metalization layers are routed and connected (along with vias) in the area above the ASIC transistor diffusion patterns.

FIG. 11b shows a cross-section diagram similar to that of FIG. 11a except that the FPGA fabric is application-specific and includes functions such as multiplier 1106 and Viterbi Decoder 1107 in addition to more conventional small grain FPGA Cells 1105. Note that, if the semi-custom approach to constructing the FPGA fabric as described above is utilized, the underlying structure for the ASIC transistor diffusion patterns 1104 in FIG. 11b may be the same as that used in the structure of FIG. 11a. This ability to customize the style of FPGA fabric by configuring only the polysilicon and metalization layers in a specific area of the device provides for a relatively easy process of adapting a generic DSP with reprogrammable instructions to specific application categories. Hence, if the semi-custom approach is utilized, once the basic underlying structure has been established, different styles of device can be manufactured targeting specific application segments without having to completely redo the entire device layout. This is especially useful at geometries of 0.13 micron and smaller where the cost of mask reticles and semiconductor fabrication NRE charges have greatly increased over previous generations. Also, the relative ease with which application targeted FPGA fabrics can be created with such a methodology facilitates the ability to do this, thereby making such targeted solutions more readily available.

Figure 12:
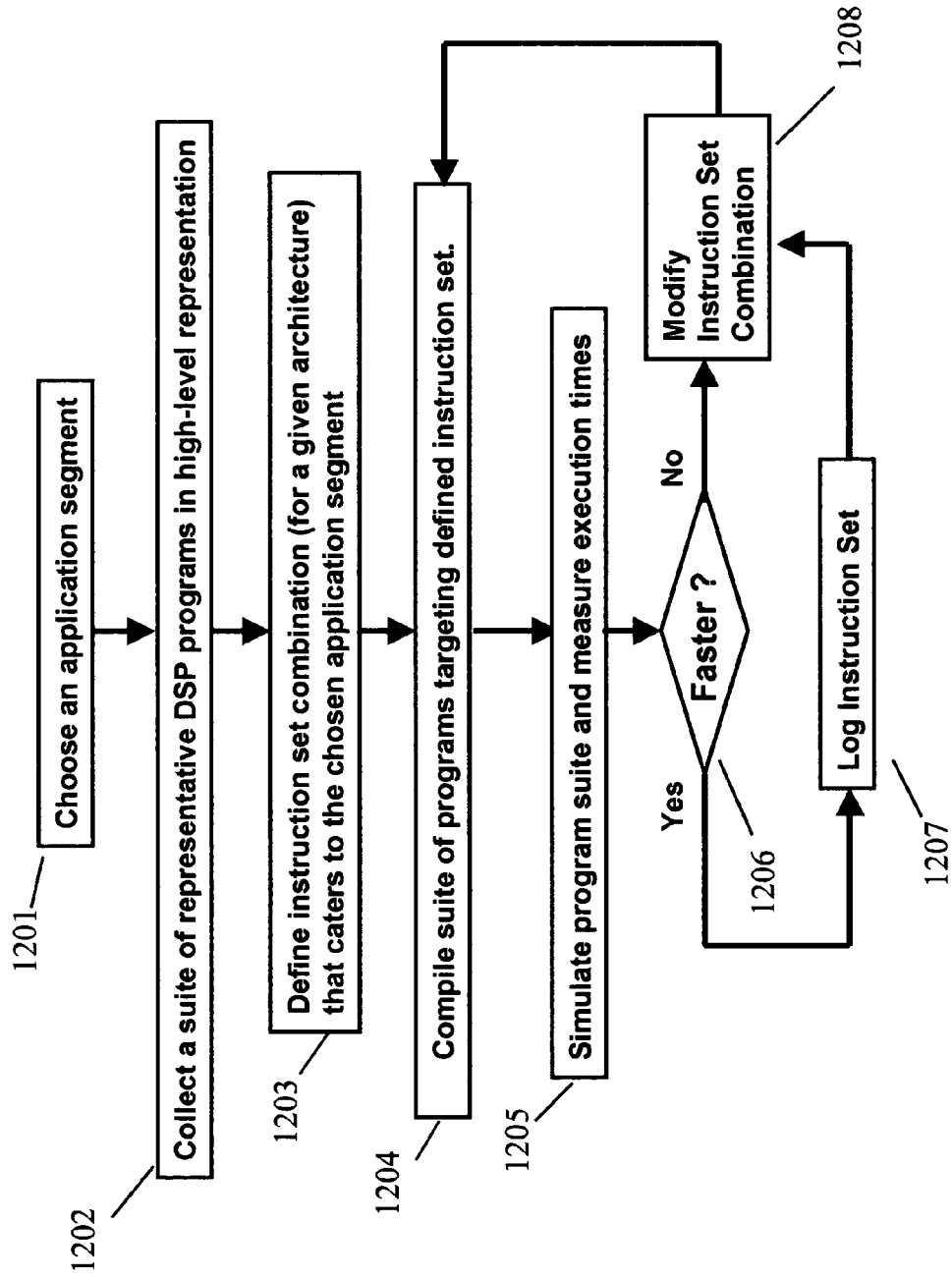
FIG. 12 shows a flow chart describing a method for determining the most suitable DSP instruction set for a particular application segment.

FIG. 12 shows a method for utilizing a reprogrammable FPGA fabric in order to construct an optimum suite of instruction set extensions for a particular user's application. Such a method could also be utilized in order to determine the best structure for the FPGA fabrics shown in FIGS. 6 through 10 in order to maximize the performance for a particular application class. The method of FIG. 12 shows an iterative process where a representative suite of DSP programs (benchmarks) are applied to different instruction set combinations programmed from a particular FPGA fabric. First an application segment is chosen in step 1201 and a suite of DSP programs representative of typical functionalities found in the target application segment are identified (step 1202). Then, in step 1203, an instruction set combination is defined that would tend to cater to the chosen application segment. The functionality of these defined instruction set combinations is made available as a model for simulation and is also supported by a software compiler. Then, in step 1204, the suite of representative programs is compiled for the defined instruction set. In step 1205, the compiled suite of programs is simulated for this variation of instruction set combinations. The execution speed of this simulation is evaluated in step 1206, and if faster than for previous instruction set combinations, this instruction set combination is logged in step 1207 to recognize it as the current choice for optimum performance. Next, a different instruction set combination is defined in step 1208, and the process continues by re-compiling the suite of programs for this new instruction set combination according to step 1204.

Figure 13:
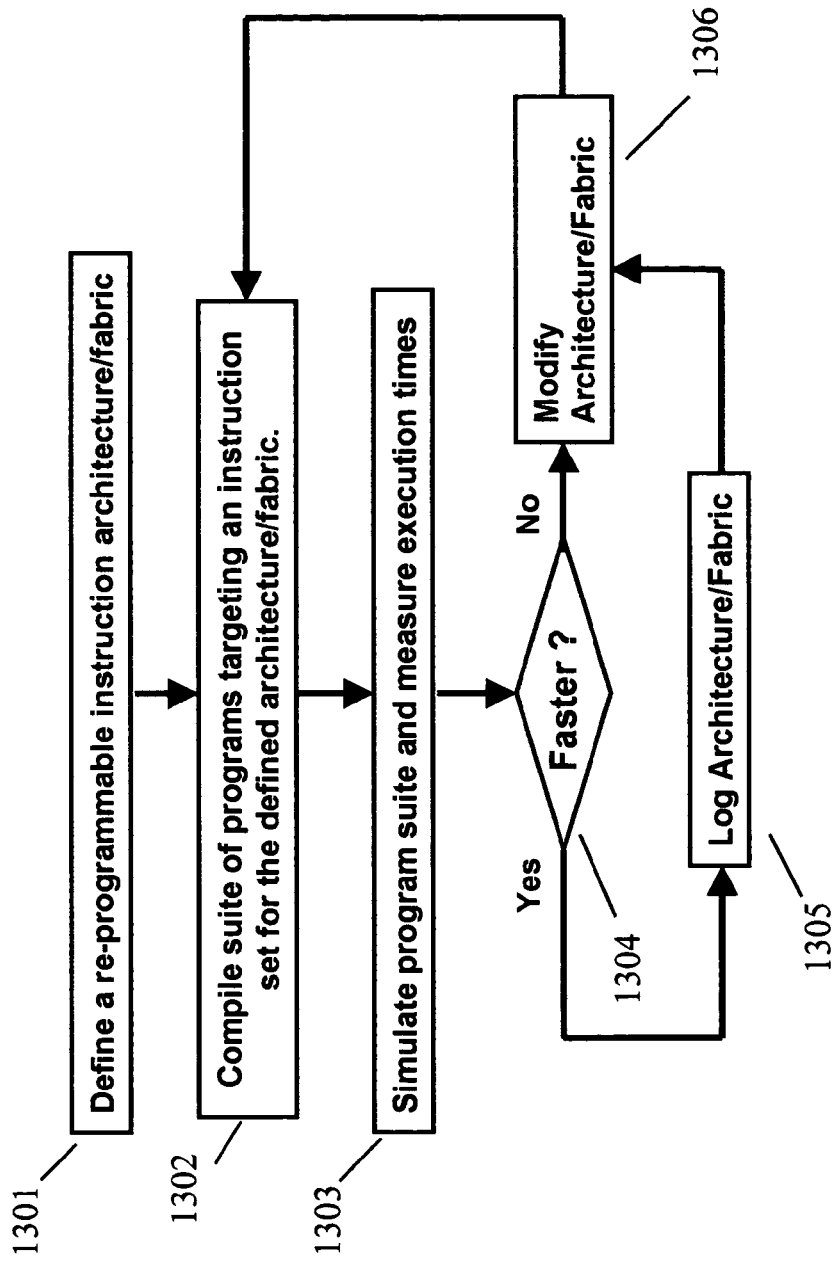
FIG. 13 shows a flow chart describing a method for determining the most suitable reprogrammable architecture and FPGA fabric to support a re-configureable DSP instruction set for a particular applications segment.

While FIG. 12 describes a method for determining an optimum instruction set for a class of applications, such an iterative method can be extended to include the determination of an optimum architecture and FPGA fabric style for a particular class of applications. FIG. 13 describes such a method, and builds upon the method of FIG. 12. In FIG. 13, the first step (1301) involves the definition of a reprogrammable instruction set FPGA architecture or fabric such as those shown in FIG. 11a or 11b. Next, a suite of representative DSP programs targeting an instruction set built on the chosen fabric are compiled (step 1302) and simulated (step 1303) in a multiple-pass iterative manner similar to that of the method of FIG. 12.

The performance of the simulated programs is logged in step 1304 and when a particular architecture/fabric produces a faster result, that fabric is logged (step 1305) as the current best performer for the targeted application segment. Next, a different architecture/fabric is defined (step 1306) and the process repeats itself until the best choice for the architecture/fabric has been determined.

FIG. 14 shows the concept of first implementing a design on a semiconductor die where the custom DSP instructions are implemented in an FPGA fabric, and then migrating that design to a different (smaller) die having an ASIC base diffusion structure for the instruction fabric. A specific user design is first implemented with custom instructions built in FPGA cells and routing 1401 built on a custom diffusion structure as is the norm for FPGA construction. In an alternative embodiment of this invention, cells and routing 1401 may be constructed using a semi-custom approach as previously described for FIGS. 11a and 11b, where the reprogrammable fabric is constructed on top of an ASIC-style sea-of-transistors base diffusion structure implemented in diffusion 1402. In this alternative embodiment, to achieve a smaller die for lower cost in high volume production, this same user design may be migrated to (implemented in) a die where the custom instructions are built in a mask-configured ASIC structure 1403 built on sea-of-transistors base diffusion structure 1404. Structure 1404 is essentially identical to structure 1402 in this alternative embodiment except that the die area for 1404 is smaller than 1402. Note that metalization 1405 and diffusion patterns 1406 that implement the DSP processor functions are substantially identical to metalization 1407 and diffusion patterns 1408 respectively. In the preferred embodiment, diffusion patterns 1402 would be custom for the FPGA fabric to be implemented, and diffusion patterns 1404 would be some form of conventional ASIC base transistor array or fabric, intended to be customized with some number of custom metal masks applied for a given user application. Note that the structure for the ASIC fabric implemented with diffusion 1404 and ASIC cells and routing may take a number of forms. ASIC fabric 1404 may contain uncommitted transistors requiring all metal layers to be customized for a given user design or some of the metal layer in ASIC cells and routing 1403 may be pre-configured such that standard modules are pre-formed, these modules being further connected with custom metal routing in the final layers to configure the device for a particular user application.

Figure 15:
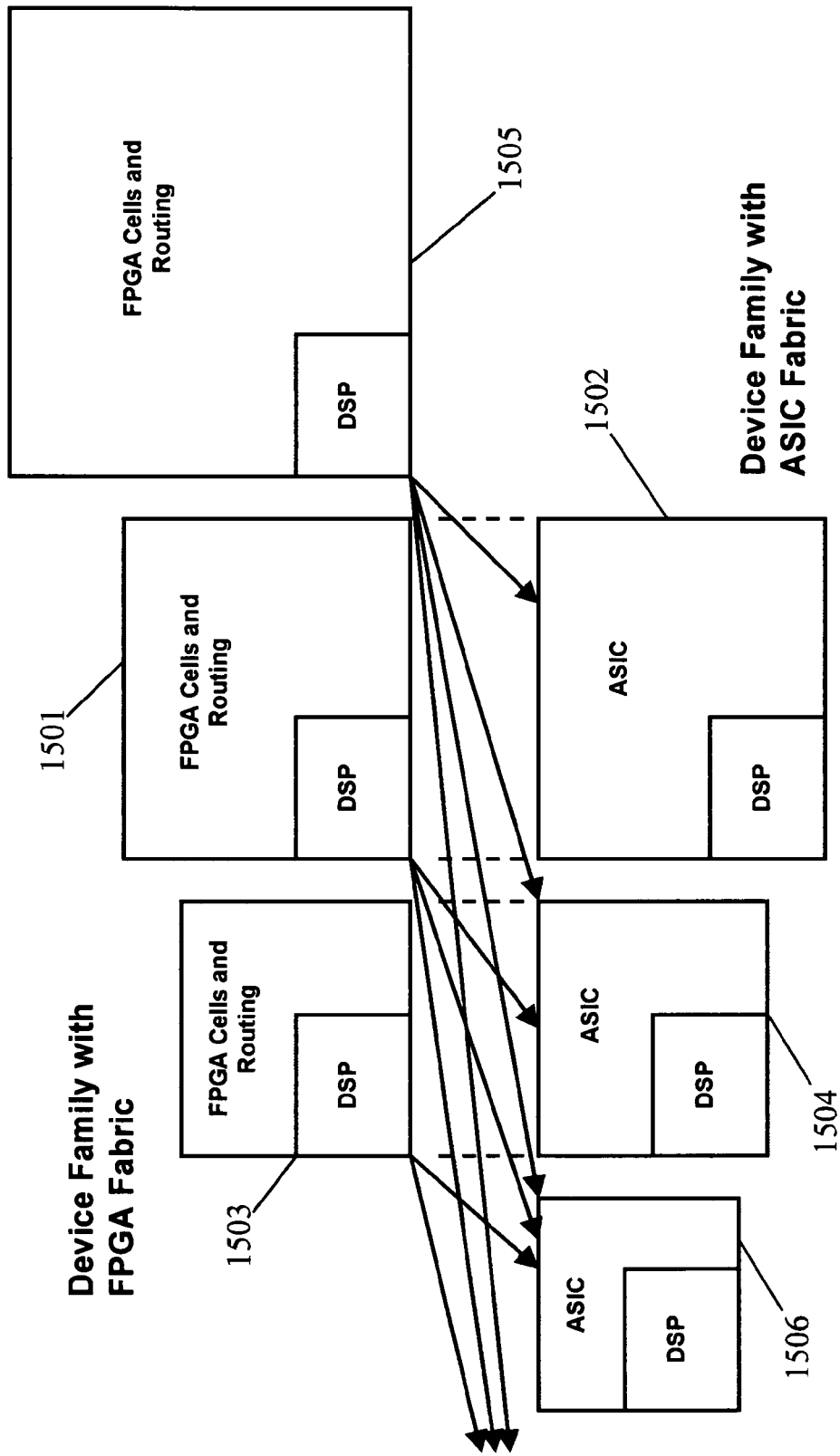
FIG. 15 demonstrates a method where a family of reprogrammable instruction DSP devices includes FPGA-based designs that can be migrated to a family of similar devices where the functionality originally implemented in the FPGA fabric of the reprogrammable instruction devices is instead implemented in ASIC technology.

FIG. 15 shows a family of Reprogrammable Instruction DSPs (1501, 1503, and 1505) and a family of Similar DSPs with hard-wired instruction fabric (1502, 1504, and 1506). Across both families, the DSP functionality is the same and all devices, whether possessing reprogrammable or hard-wired instruction fabric, have the same I/Os, RAM, and other supporting functions as will be demonstrated in FIG. 16. The arrows in FIG. 15 indicate that the functionality of any member of the reprogrammable device family can be migrated to a member of the hard-wired device family, thereby reducing the overall die size of the device. A unique design flow (method) for using both families will be demonstrated in FIG. 17.

In an alternative embodiment, FIG. 15 can be used to demonstrate how a single family of base die can be used to build a family of DSP devices with reprogrammable FPGA-style instruction extension functionality and a family of DSP devices with mask-configured ASIC-style instruction extension functionality. Note that, for this alternative embodiment, the base die (diffusion) pattern for device 1501 is identical to that of device 1502. Here, the diffusion fabrics are constructed with a semi-custom approach for both the FPGA fabric of 1501 and the ASIC fabric of 1502, as described earlier with regard to alternative embodiments for FIGS. 11 and 14. In other words, the same base (partially-fabricated) wafers can be used to build both 1501 and 1502. In a similar way, the base die (diffusion) pattern for device 1503 can be identical to device 1504. When taking advantage of this alternative method, user designs that are prototyped in (or enter production) in a device with FPGA-style functionality, can be migrated to a smaller die by implementing the custom instructions in ASIC-style functionality. Thus, a design implemented in device 1505 may be migrated to device 1502, 1504, or 1506, or an even smaller die, depending on the particular design and the required amount of custom functionality. It should be noted that the concept described for the alternative embodiment for FIG. 15 where a single family of base wafers is utilized to implement families of both FPGA-style and ASIC-style function is unique in the industry. Also unique is using the ASIC-style family for volume production cost reduction for designs initially implemented in the FPGA-style family, where both families are built on a common family of base-wafers.

Figure 16:
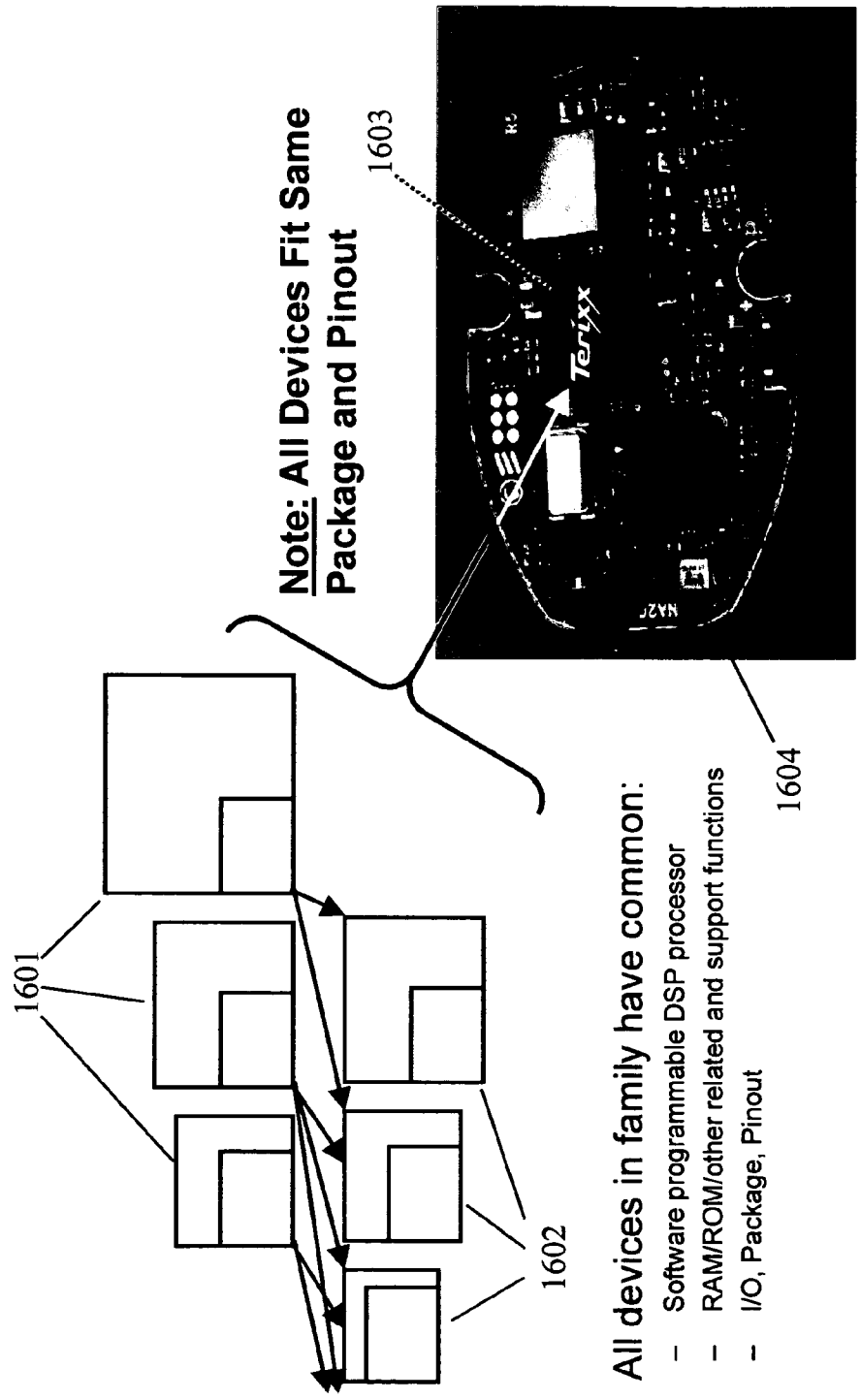
FIG. 16 further demonstrates that all devices within the families shown, whether FPGA-based or ASIC-based, hae identical DSP and I/O functionality, and can therefore operate in the same socket in the same application.

FIG. 16 emphasizes how families of rDSP devices and their hard-wired counterparts can be constructed such that all devices within both groups can plug into the same socket 1603 in the user's product 1604 and perform the same function. Actually, the larger devices will be able to fit more software functionality in their FPGA/ASIC fabric and therefore have higher performance—but with the same function. Alternately, the devices containing larger amounts of FPGA/ASIC fabric may operate at a reduced clock rate to achieve lower power, instead of operating at a higher clock rate.

All devices shown in FIG. 16, whether having reprogrammable fabric 1601 or hard-wired ASIC fabric 1602, contain identical conventional DSP functionality including supporting functions like timers, RAM, ROM, and PLLs. All devices in both reprogrammable and hard-wired families also have identical I/O functionality, and are therefore capable of plugging into the same socket 1603 in user system 1604. Having identical numbers of I/Os in smaller and larger devices is contrary to current practice in building FPGAs. In all existing FPGAs, the larger devices always have more I/Os than the smaller devices since the periphery of the larger devices permits adding more I/Os. To not add more I/Os would seem to be wasting area, however in the present invention, it enables the exact substitution of larger rDSPs for smaller rDSPs.

Figure 17:
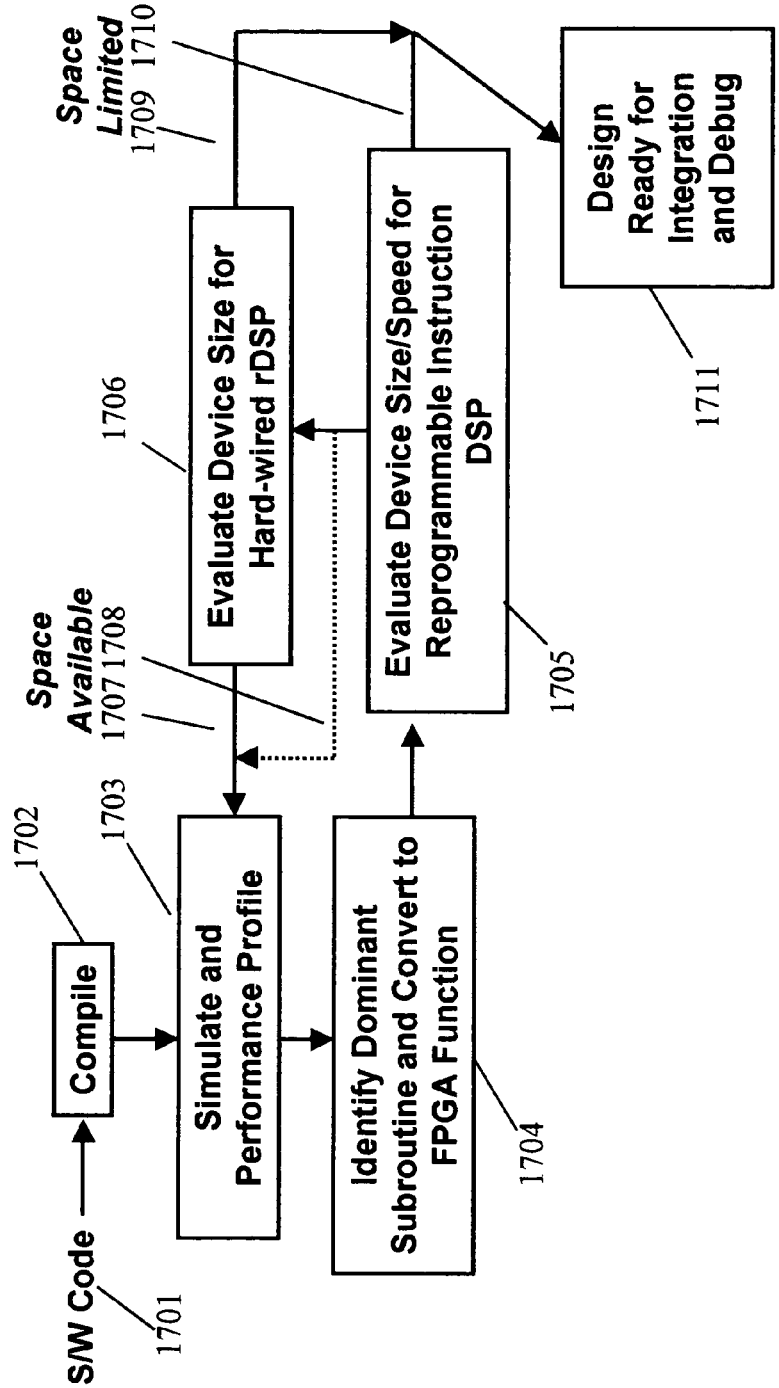
FIG. 17 shows a flow chart for the development process using the device families of FIGS. 15 and 16, where the initial development process for the reprogrammable instruction DSP includes a provision for evaluating which of the ASIC-based family members is capable of implementing the reprogrammable instruction functionality when it is later hard-wired, the result being a more cost-effective solution for volume production.

FIG. 17 shows the design flow for a Reprogrammable Instruction DSP (rDSP) performed with awareness of the hard-wired ASIC version. This flow is significant because it is often the case that the cost of the ASIC version in volume production is the most critical factor to be considered once the performance goal has been met. Therefore, in isolating and moving software subroutines into FPGA functionality, the flow will also include an estimation of whether the currently defined functionality will fit in the hard-wired ASIC counterpart. First, software code 1701 is compiled 1702 and then goes to a process of simulation and performance profiling 1703. Then, as a result of profiling and determining which subroutines are dominating the processor's execution time, that subroutine which consumes the largest percentage of processor run time is isolated and converted 1704 to FPGA functionality for implementation in the reprogrammable function area of the rDSP.

Next, the overall performance of the rDSP, including the software-programmable conventional DSP function combined with the reprogrammable FPGA function is evaluated 1705. Simultaneously, evaluation step 1705 also includes a comparison of the size required for the reprogrammable function relative to the reprogrammable area available in the various members of the rDSP family. If there is significant space still available in the family member that currently can contain the FPGA functionality defined so far, the process will continue, and optionally be further evaluated in step 1706 to see if the defined hardware functionality will fit in the chosen hard-wired ASIC version. In fact, step 1706 may be significantly more important than step 1705 regarding device size for a company that is only concerned about volume production prices and not al all concerned about device cost during the initial production stage. In this regard, a variation on the flow shown in FIG. 17 would not include step 1705 and only include step 1706 for the purposes of evaluation.

If additional space is available in either the reprogrammable version 1708 or in the hard-wired version 1707, or both, simulation and performance profiling 1703 will be performed again, followed by subroutine identification and conversion 1704, and then further size and speed evaluation 1705 and/or 1706. Finally, when the performance requirement has been met, and/or the current member of the rDSP family containing the FPGA functionality has limited space 1710 to add additional functionality, and/or the hard-wired version has limited space 1709 to add additional functionality (the choice here depending on the focus of the user company), the overall rDSP design is declared ready for implementation, integration, and debug 1711. If the performance has not met the desired goal, the cycle can continue with the "space available" comparison steps 1707 and 1708 being performed relative to a larger rDSP family member (reprogrammable instruction and/or hard-wired instruction version).

Figure 18:
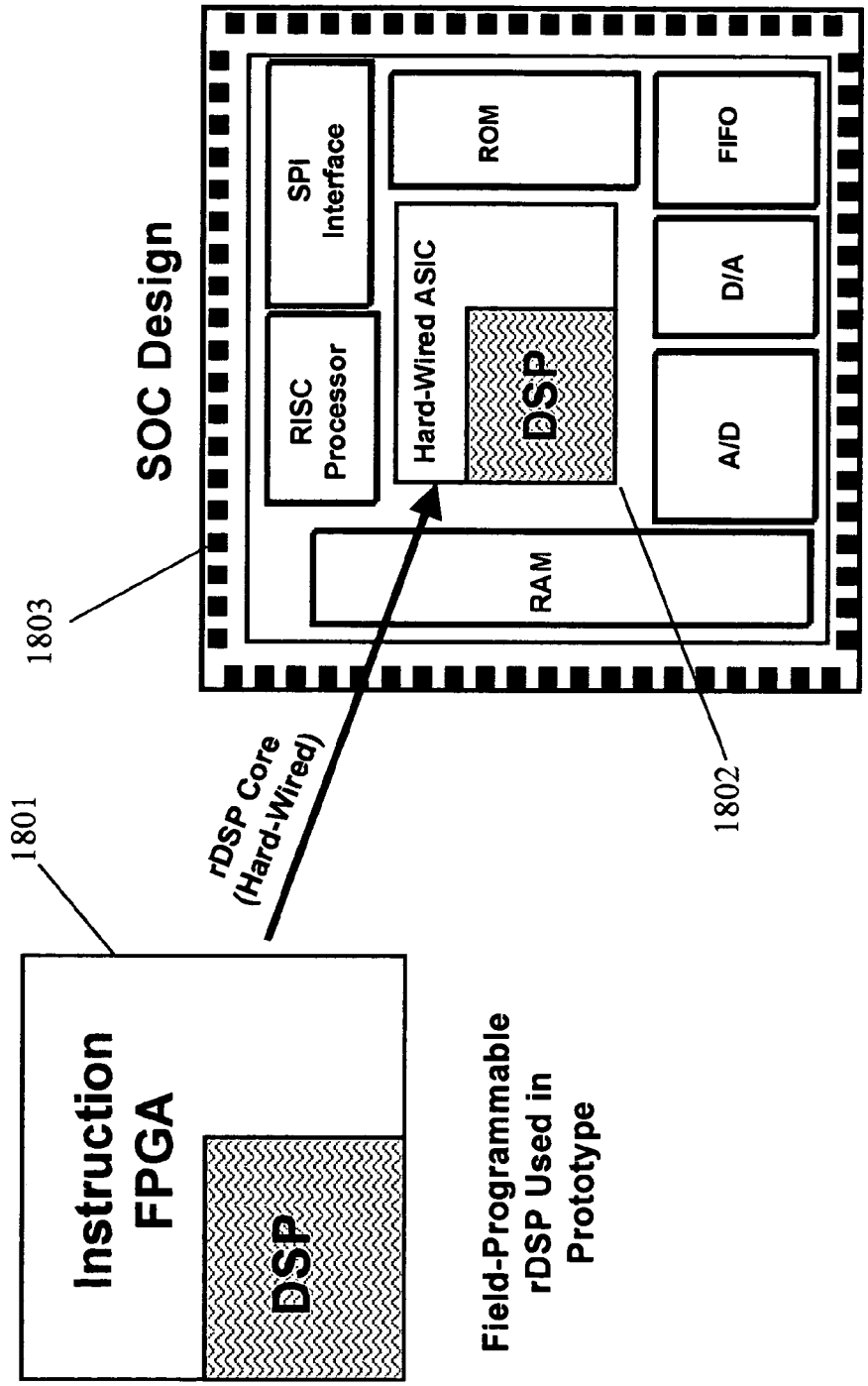
FIG. 18 shows a method for prototyping a design intended for a SOC device using a reprogrammable instruction DSP, where for the volume production SOC device, the hard-wire version of the reprogrammable instruction is used.

Another method comes into play when the user company is building an SOC (System On Chip) device that needs DSP functionality. Here the rDSP with reprogrammable instruction fabric 1801 is utilized to aid in speeding the development flow while, at the same time, not compromising the cost for the volume production SOC. This is accomplished as shown in FIG. 18 by utilizing the discrete rDSP device 1801 with reprogrammable FPGA instruction fabric for board-level prototyping and emulation, and them providing the same functionality in the SOC 1803 by embedding an IP core version of the rDSP function 1802 where the instruction fabric is implemented with hard-wired ASIC.

The general topic of reprogrammable hardware goes beyond simply using FPGA-style reprogrammable logic to implement a function. In some implementations that have been described (the processor from Chameleon Systems is an example), it may be desirable to alter the device's functionality during operation. Such dynamic alteration allows the hardware resources of the device to be used for a first functionality at one point in time, and a second functionality a few moments later, thus increasing the overall effective functionality without a proportionate increase in the device size.

Reprogrammable hardware implementations are often configured by SRAM where a primary RAM cell controls the current configuration of a connection point or logic function and a "shadow" RAM cell or cells can be loaded with alternate pattern(s) to be transferred into the primary configuration RAM very quickly—sometimes within a few clock periods.

Figure 19:
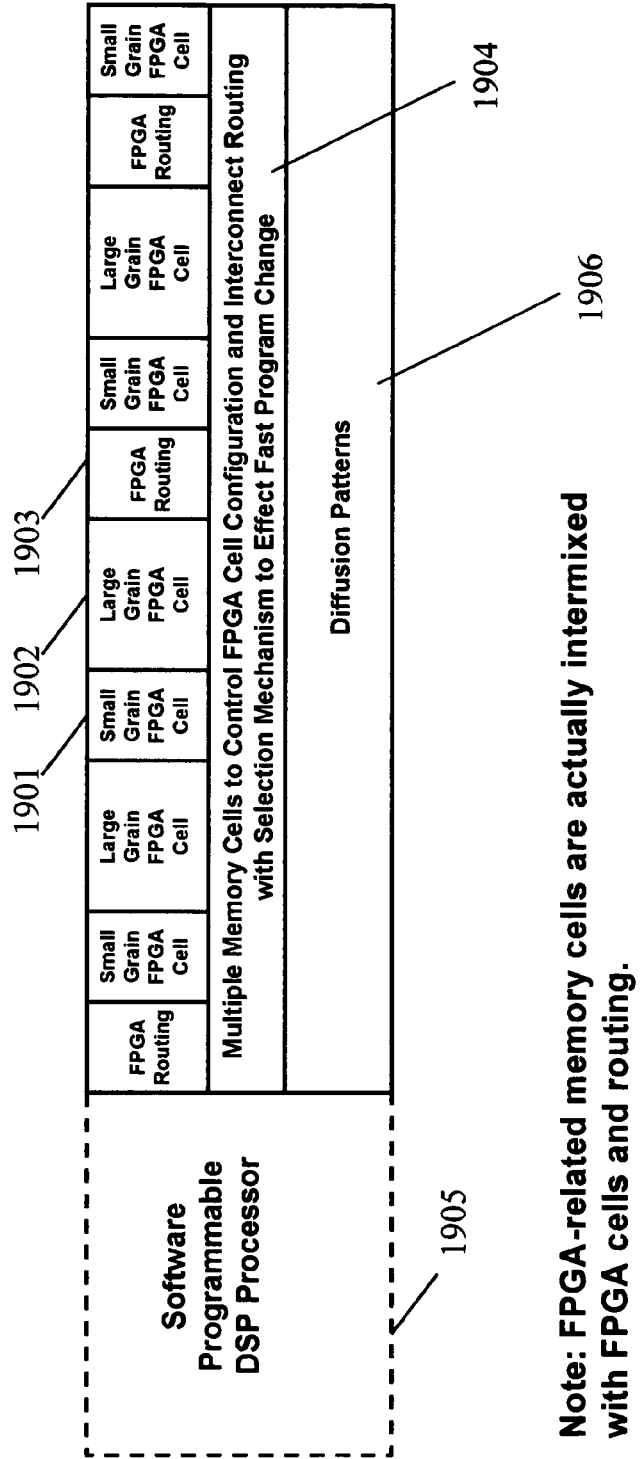
FIG. 19 describes the functionality for a multi-program FPGA fabric.

A similar structure to those shown in previous rDSP cross-section diagrams is shown in FIG. 19, except here, the FPGA functionality is controlled by multiple numbers of cells per connection point and per logic function such that the FPGA functionality can be quickly changed to a different configuration. Unlike other cross section diagrams in this specification, FIG. 19 includes a logical cross-section where the array of multiple memory cells 1904 acts as a controlling layer for the FPGA functionality—in actuality, cells 1904 are physically intermixed with the FPGA cells and routing. Note that both small grain FPGA Cells 1901 and large grain FPGA Cells 1902 are controlled by multiple sets of configuration memory cells, just as FPGA Routing connection points 1903 are each controlled by multiple memory cells built on diffusion 1906.

Please note that this multi program FPGA fabric, which will be described in more detail, can exist independently of any specific processor functions, and could actually be embodied in a device containing only the multi-program FPGA fabric, or embedded in a SOC ASIC as an independent IP core. However, as shown in FIG. 19, a multi-program FPGA fabric may implement reprogrammable instruction extensions for conventional DSP processor 1905. From a physical standpoint, the multi program FPGA structure can also be constructed using a semi-custom approach on an ASIC diffusion fabric containing an array of uncommitted or partially committed transistors 1906, such as that shown for an alternative embodiment earlier in this specification.

Figure 20:
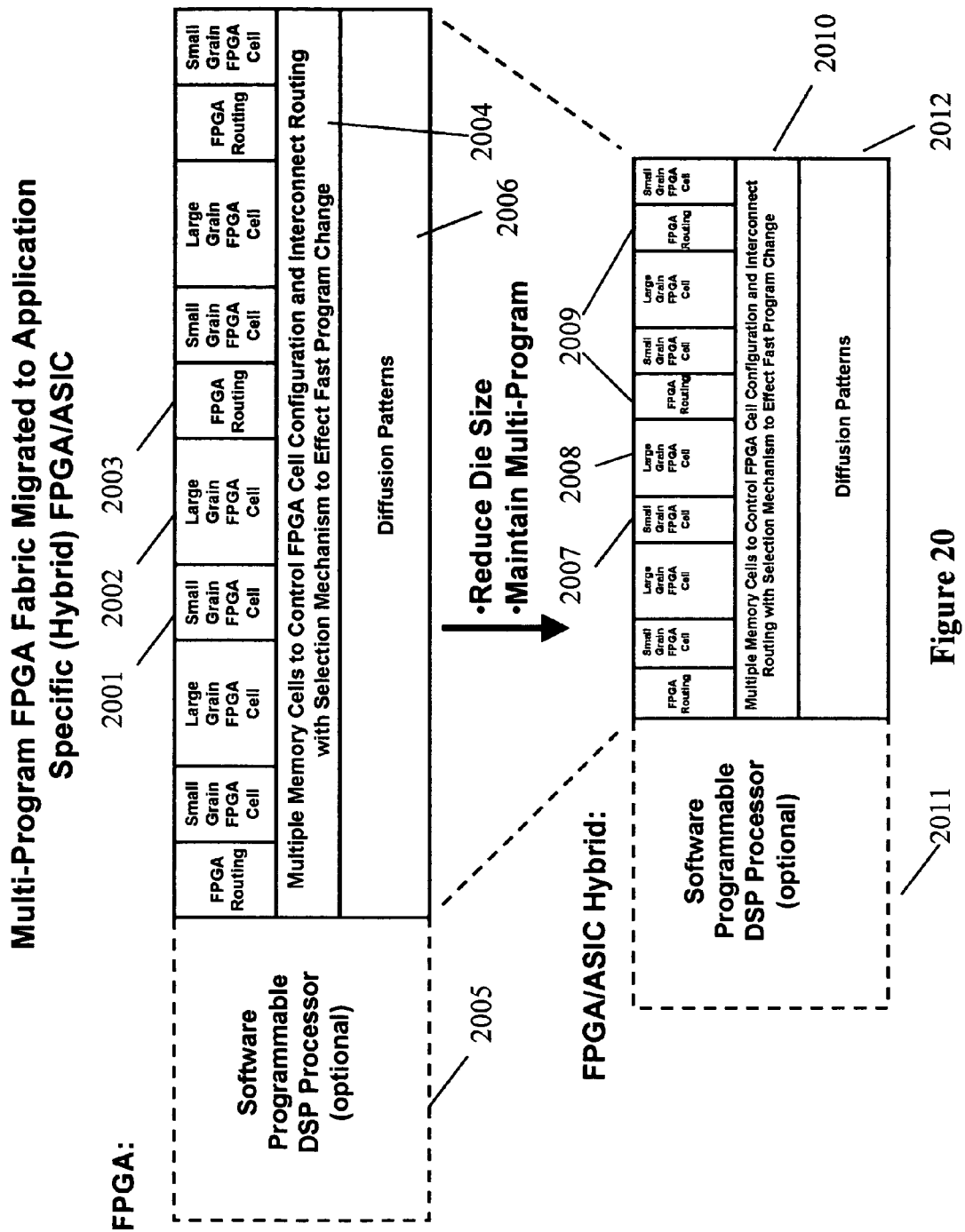
FIG. 20 shows how a design implemented in a multi-program FPGA fabric can be migrated to an ASIC equivalent having a smaller die size while retaining the multi-program capability.

FIG. 20 shows how a specific application design first implemented in the multi program FPGA fabric of FIG. 19 can be migrated to a more silicon-efficient implementation where some of the FPGA cell and routing functionality is implemented in mask-configured ASIC technology, resulting in a form of hybrid FPGA/ASIC implementation. Note that such an implementation can be constructed as a full custom implementation, on a Standard Cell platform where all semiconductor masks are custom, or can be constructed using a semi-custom approach on an ASIC-style fabric containing uncommitted or partially committed transistors as described earlier in this specification.

In the initial implementation, FPGA logic Cells 2001 and 2002 as well as FPGA Routing 2003 contain the full flexibility of the FPGA technology utilized. Configuration memory cells 2004 contain the full complement of cells required to support all possible functionalities of the FPGA in two or more program configurations. To achieve a lower device cost for higher volume production and/or to achieve lower power consumption, a specific multi-program user design may be migrated according to this invention to an ASIC implementation, where the required multi-program memory cells are retained in order to implement the specific application including the multi program capability. However, any connection points or logic functions that need not be programmable are deleted or hard-wired as appropriate, their memory control cells also being deleted. Thus, FPGA Cells 2007 and 2008 may be reduced in size or otherwise simplified, and FPGA routing 2009 will now comprise a combination of FPGA programmable routing connection points and hard-wired ASIC connections—a unique form of hybrid FPGA/ASIC. Multi programmed memory cells 2010 will now consist of a much smaller number of cells since only those actually required to implement the specific multi-program application will remain. All other (unnecessary) cells have been deleted in the process of performing this migration. Note that DSP processor functions 2005 and 2011 are usually identical when the multi-program FPGA fabric is used in conjunction with a conventional DSP processor.

Note that this multi-program FPGA fabric and the ASIC migration method shown can also be employed in conjunction with any other processor type (ie. RISC processor) or other fixed functions, or alternately can be implemented as a standalone FPGA or an FPGA fabric embedded in an SOC (System on Chip) design—in all cases using the method described herein to migrate to a lower cost ASIC implementation.

Figure 21:
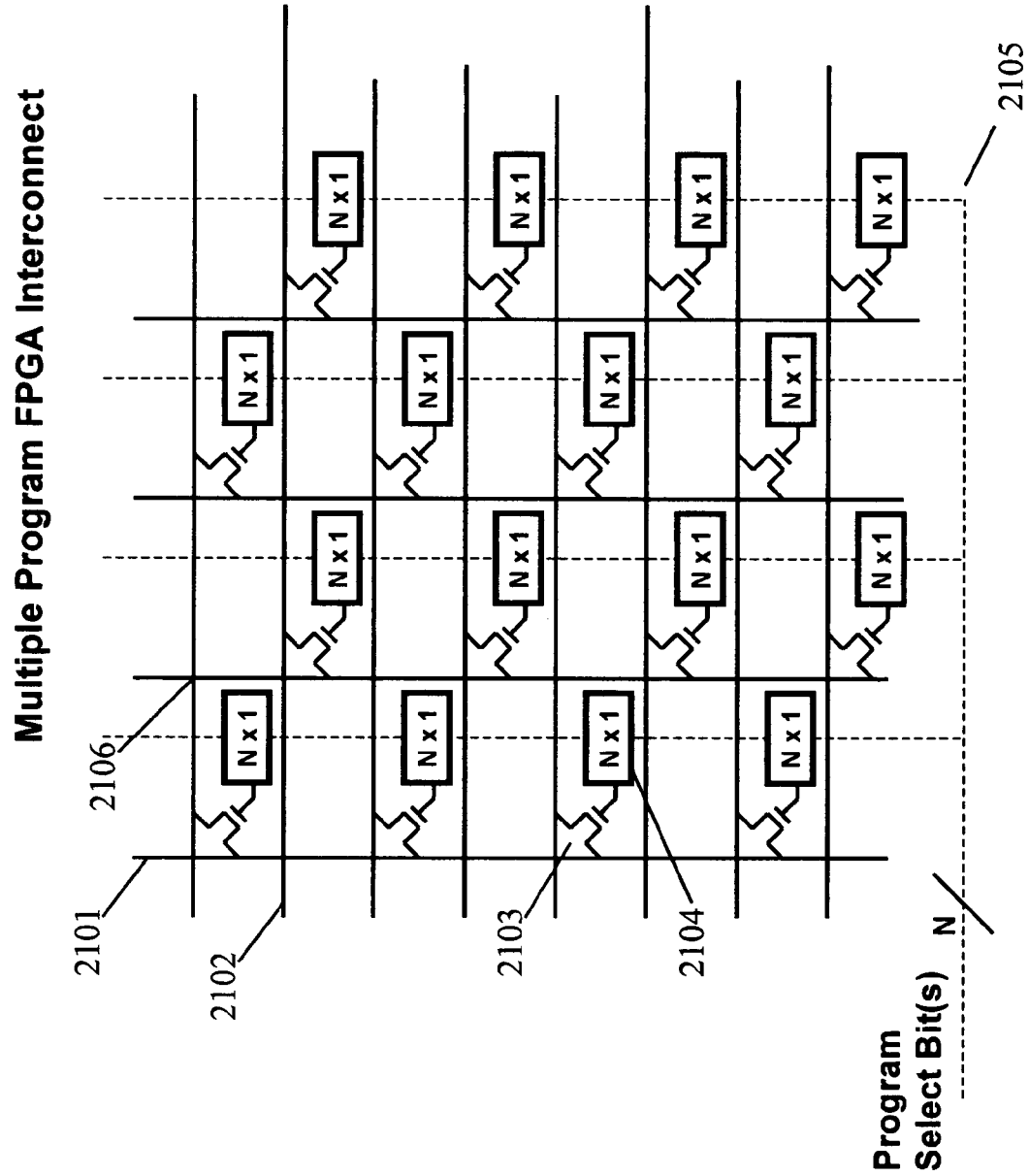
FIG. 21 shows a multi-program FPGA interconnect matrix with multi-location RAM cells controlling each programmable connection point in the matrix.

To further demonstrate the method of this invention for migrating a multi-program FPGA fabric to a hybrid FPGA/ASIC implementation, it is first useful to define an example FPGA interconnect matrix like the one shown in FIG. 21. FPGA interconnect matrices can be constructed in a variety of styles including a variety of connection point de-population schemes. FIG. 21 arbitrarily shows an interconnect matrix that is 50% populated. Here vertical routing lines 2101 and horizontal lines 2102 may be programmably connected by transistor pass-gates 2103 which are controlled by multi-location RAM cells 2104. As mentioned earlier, there are different styles of multi program configuration RAM cells that are utilized in reprogrammable hardware including variations on a "shadow" RAM structure. The multi program RAM of FIG. 21 is a relatively simple implementation where two or more different programs are supported, each individual program being selected by (N) program selection bits 2105 which supply the address for each RAM cell block 2104. De-populated matrix intersection points like 2106 have no transistor pass-gates nor configuration RAM cells.

Although the method described here focuses on the FPGA interconnect (which normally dominates silicon usage in a typical reprogrammable FPGA by a factor of three to one over the logic cells), a similar scheme may be implemented within the FPGA logic cells, if those cells contain reprogrammable functionality. Some FPGA logic Cells, like an ALU or the well-known look-up table (LUT) are highly programmable and could be implemented as multi programmable by substituting multiple location RAM blocks where a single RAM cell is normally used for configuration. In other implementations, some or all FPGA logic cells may have a fixed functionality such as a multiplexer or a multiplier. Other implementations may have a mixture of some logic cells that are programmable and some that are not.

Figure 22:
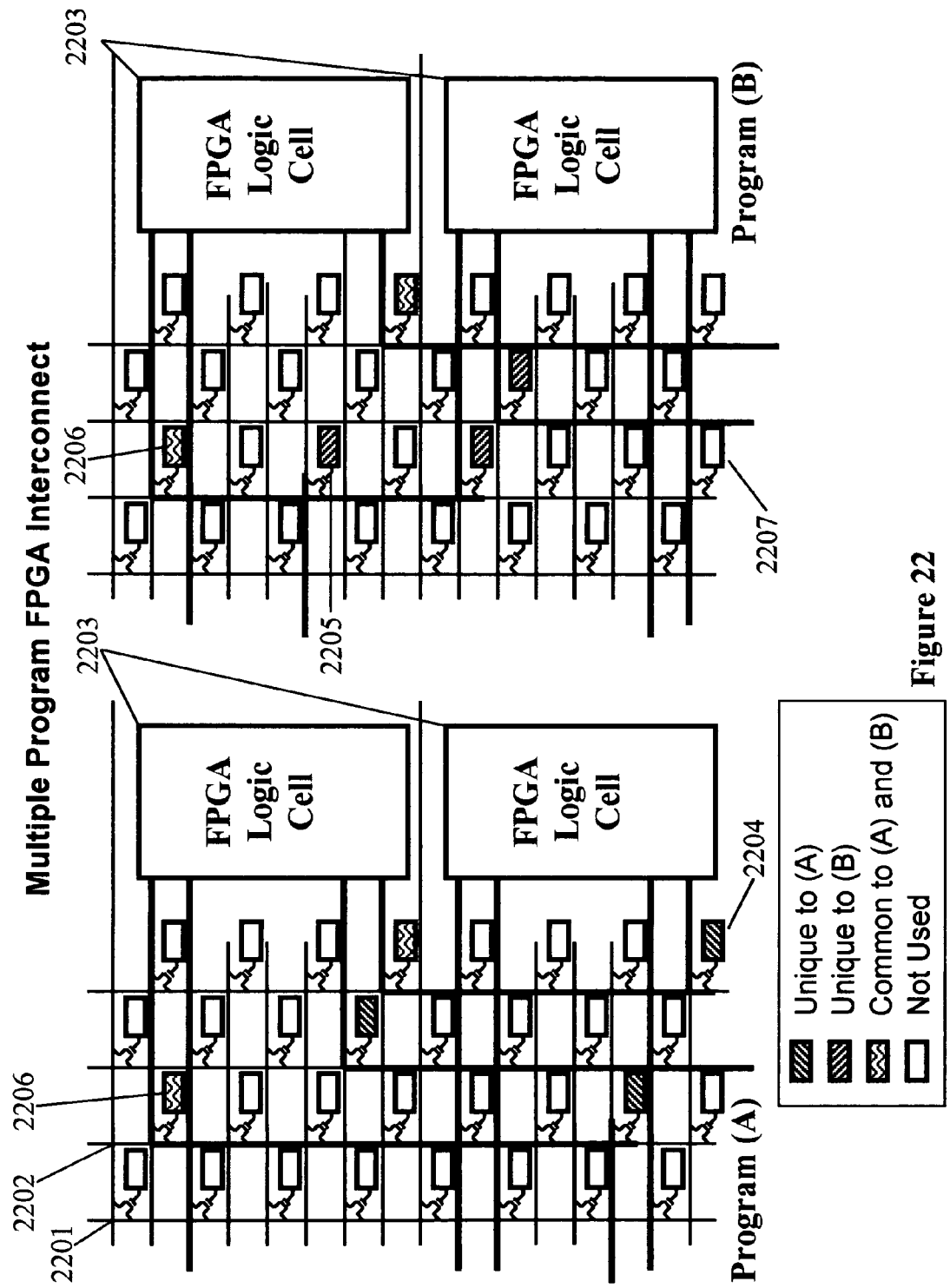
FIG. 22 shows how a multi-program FPGA interconnect matrix can be configured to implement two different connection functionalities.

To further describe how a multi-program FPGA implementation can be migrated to an ASIC implementation according to this invention, it is appropriate to describe a simple example with two different programs, such as that shown in FIG. 22. FIG. 22 contains two programs, A and B, that are applied to multi-program FPGA interconnect structures each containing populated matrix intersections 2201 and de-populated matrix intersections 2202. Notice that FPGA logic cells 2203 may also contain multi-program configuration RAM where some consolidation is performed in migrating a particular application design to a hybrid FPGA/ASIC implementation. Also, FPGA logic cells that are not used by either program A or program B are deleted in the migration process. Connection cells that are common to all programs may be implemented with fixed wiring.

If it is known that a multi-program FPGA design might possibly be migrated to a hybrid FPGA/ASIC implementation, it is advantageous to first achieve a routing pattern for program A that has as many selected connection points as possible in common with those required for program B. This way, when the routing patterns for program A and program B are consolidated, the most efficient merging of resources will result.

The consolidation process requires identifying programmable connection points 2206 that are common to both programs—essentially always requiring a connection to be made regardless of the program implemented. These can later be eliminated and turned into hard-wired connections. Then, programmable connection points 2204 which are utilized only by program A, and programmable connection points 2205 which are utilized only by program B, are identified. These must be retained as programmable connections in the consolidated implementation. All other programmable connection points 2207, that are not utilized by either program are identified, and eliminated, in the consolidated implementation.

Figure 23:
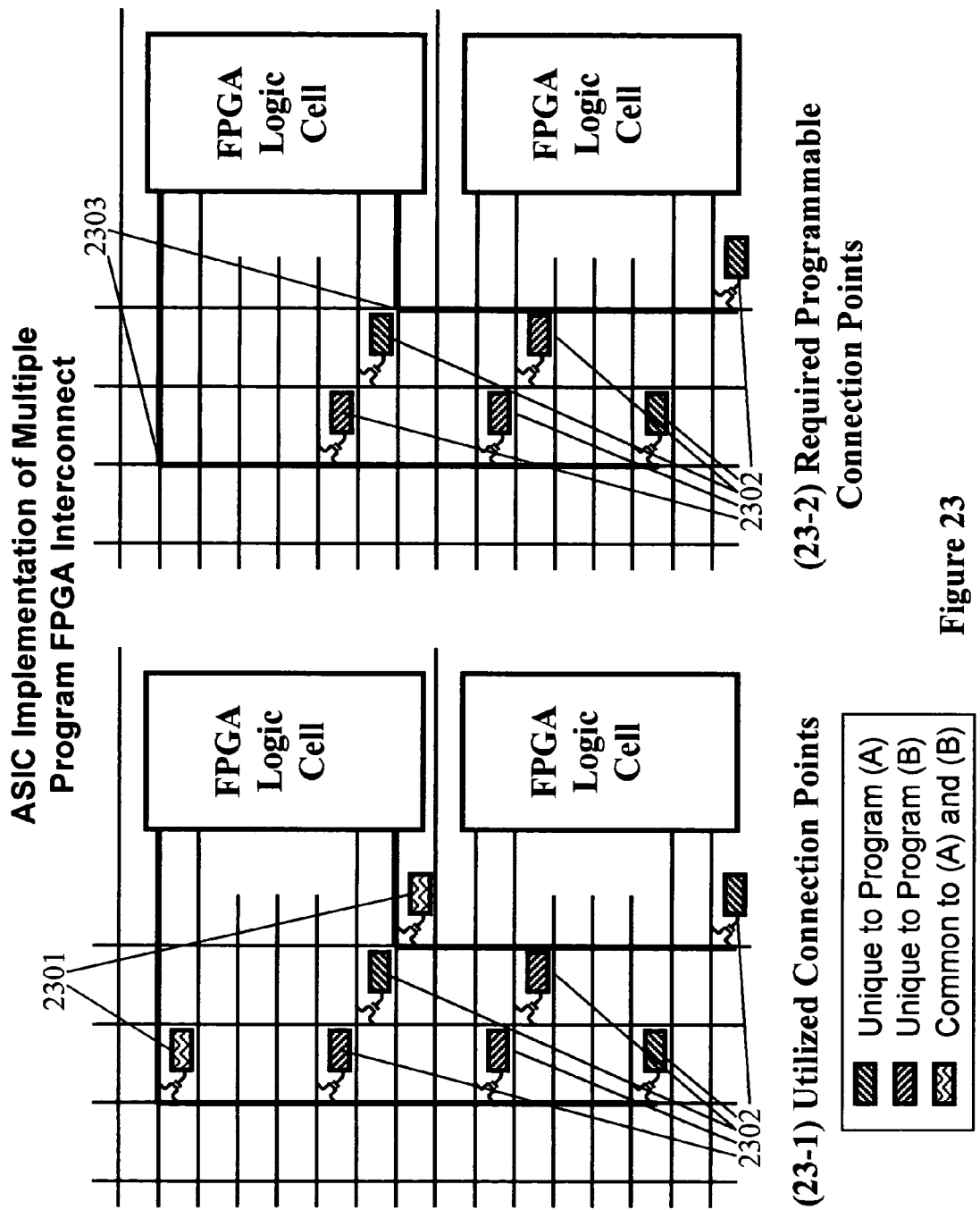
FIG. 23 shows how certain programmable connection points within a multi-program FPGA design are identified as part of the process of creating an ASIC equivalent having a smaller die size while retaining the multi-program capability.

FIG. 23 shows a similar view of the programmable connection points used by programs A and B where diagram 23-1 shows all programmable connection points that are used by either program and diagram 23-2 shows the programmable connection points 2302 that must remain programmable in the consolidated (hybrid) implementation. As described earlier, connection points 2301 that are used by both programs may be replaced by hard-wired connections 2303.

Figure 24:
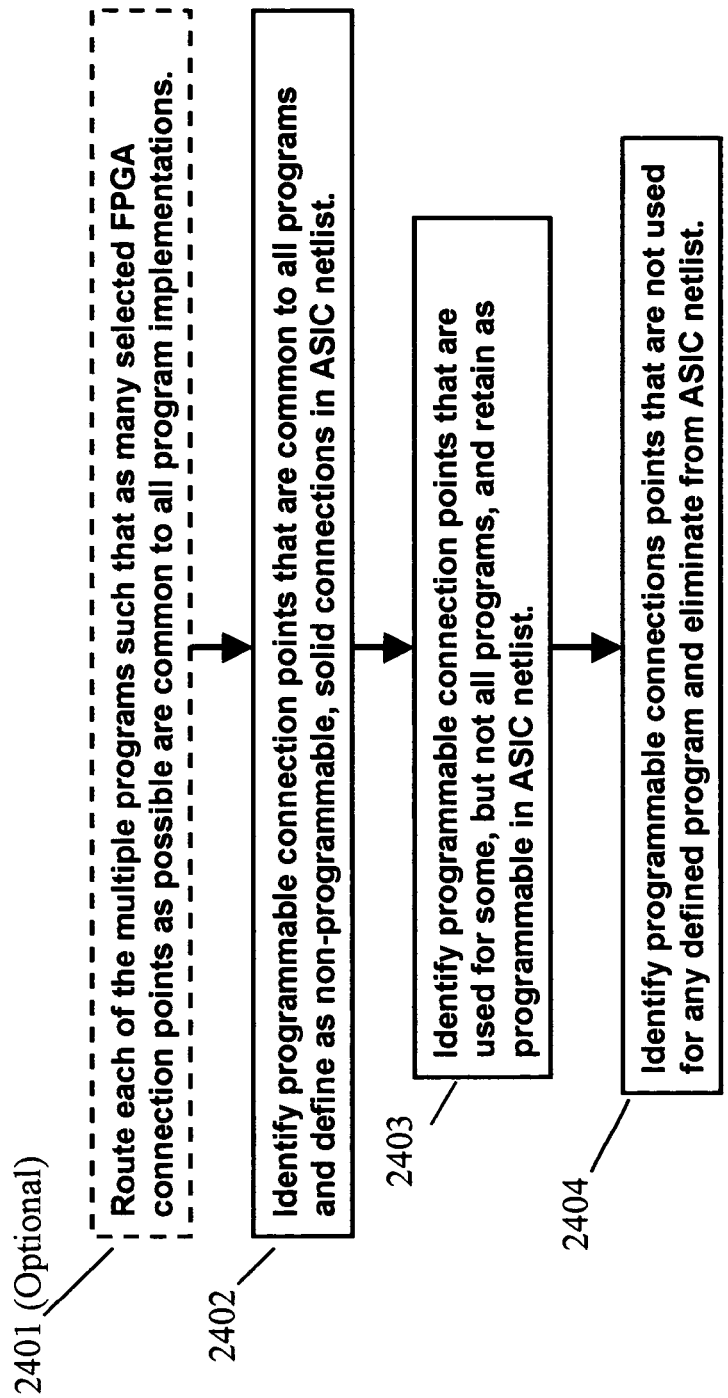
FIG. 24 shows a method for identifying and removing programmable connection points in converting a multi-program FPGA to an ASIC equivalent having a smaller die size while retaining the multi-program capability.

FIG. 24 describes a method for removing or altering programmable connection points when migrating (consolidating) a multi program FPGA design to a hybrid FPGA/ASIC implementation. Again, the focus is on reducing the silicon area required for interconnect since this is the dominant size factor for FPGAs. A similar method may be applied within the FPGA logic cells, if and where programmability exists.

The first-step, 2401, is optional, and describes that the FPGA routing patterns for programs A and B in the initial implementation should have as many programmable connection points as possible in common. This can be accomplished in a variety of ways when the routing software is executed for programs A and B. One method would be to create a routing pattern for program A and then use this routing pattern as a starting point to create the pattern for program B. Some variation on a "rip-up and re-try" algorithm may be utilized here. Then, one could create a routing pattern for program B and then use this routing pattern as a starting point to create the pattern for program A. The results for the two exercises can then be compared, with that exhibiting the greatest number of common programmable connection points utilized being kept as the preferred patterns. Of course the required performance and capacity requirements must also be taken into account here.

In order to consolidate multiple programs such that they may be retained in the hybrid FPGA/ASIC, the next step 2402 is to identify connection points that are common to all programs and define these as non-programmable, solid connections in the hybrid FPGA/ASIC netlist. Then, in step 2403, connection points that are used for some, but not all programs are identified to be retained as programmable in the hybrid FPGA/ASIC netlist. Finally, in step 2404, connection points are identified that are not used for any defined program, and these are eliminated from the hybrid FPGA/ASIC netlist. Typically this last category will comprise the majority of the connection points in the initial FPGA structure and will therefore account for the largest amount of silicon area reduction after the specific design has been migrated to the hybrid FPGA/ASIC implementation. The physical layout for an FPGA connection matrix is normally very regular. In the hybrid FPGA/ASIC implementation just described, the remaining programmable connection points, after de-population, will no longer be easily layed-out in a regular array. Although this will result in some loss of silicon area efficiency, the relatively large number of deleted, unused connection points will make the hybrid FPGA/ASIC a significantly smaller die nonetheless.

What is claimed is:

1. A family of two or more ASIC devices comprising a processor having mask-programmable instructions implemented in ASIC logic, wherein each device member of the family has different amounts of ASIC logic available, and wherein each member of the device family has substantially identical processors, processor memory, and numbers of input/output connections (I/O), and wherein all device members of the family are configured to plug into the same socket in a target system and function properly.

2. An integrated circuit, comprising:
a fixed portion comprising one or more fixed logic blocks;
a reprogrammable portion comprising a plurality of reprogrammable logic blocks; and
instruction logic coupled to the one or more fixed logic blocks and to the plurality of reprogrammable logic blocks, wherein the instruction logic is configured to decode an instruction stream of a software program to sequentially provide control signals to the one or more fixed logic blocks and to the plurality of reprogrammable logic blocks according to a sequence of execution of the software program and wherein the instruction logic is further configured to wait until the reprogrammable portion returns a result from an operation performed according to an instruction of the software program before providing an immediately subsequent instruction of the software program to the fixed portion.

3. The integrated circuit of claim 2, wherein the reprogrammable portion is subordinate to the fixed portion.

4. The integrated circuit of claim 2, wherein the fixed portion is a software-programmable digital signal processor (DSP).

5. The integrated circuit of claim 2, wherein the reprogrammable portion is a field-programmable gate array (FPGA).

6. The integrated circuit of claim 2, wherein substantially all of the plurality of reprogrammable logic blocks are identical.

7. The integrated circuit of claim 2, wherein the plurality of reprogrammable logic blocks include at least two different reprogrammable logic block types that differs by an amount of logic and/or a type of logic.

8. The integrated circuit of claim 2, wherein the reprogrammable portion further comprises at least one application-specific function block.

9. The integrated circuit of claim 8, wherein the at least one application-specific function block is a Multiplier, Barrel Shifter, Bit-Reverse Address Generator, Auto-Scaling Unit, Large Multiplier, or Viterbi Decoder.

10. The integrated circuit of claim 2, wherein the fixed portion comprises the instruction logic.

11. The integrated circuit of claim 2, wherein the instruction logic is at least partially reprogrammable to provide a reprogrammable instruction set.

12. The integrated circuit of claim 11, wherein the at least partially reprogrammable instruction logic is configured to perform instruction decoding for at least some of the fixed portion.

13. The integrated circuit of claim 11, wherein the at least partially reprogrammable instruction logic comprises:
a content-addressable memory (CAM) configured to accept results signals from the fixed function blocks, the reprogrammable logic blocks, and/or data path elements of the integrated circuit, and to encode the accepted results signals; and
a memory element comprising:
a first set of address inputs, coupled to outputs of the CAM, to receive an encoded signal from the CAM; and
a second set of address inputs, coupled to an instruction fetch logic element of the integrated circuit, to accept instruction signals according to the software program, and to decode the encoded signal to control the plurality of reprogrammable logic blocks and/or the one or more fixed logic blocks.

14. A family of two or more integrated circuit devices, each comprising:
a fixed portion comprising one or more fixed logic blocks; and
a reprogrammable portion comprising a plurality of reprogrammable logic blocks, wherein each device member of the family has different numbers of reprogrammable logic blocks, and wherein each member of the device family has substantially identical numbers of fixed logic blocks, memory, and numbers of input/output connections (I/O), and wherein all device members of the family are configured to plug into the same socket in a target system and function properly.

15. The family of two or more integrated circuit devices of claim 14, wherein all device members comprise instruction logic coupled to the one or more fixed logic blocks and to the plurality of reprogrammable logic blocks, wherein the instruction logic is configured to decode an instruction stream of a software program to sequentially provide control signals to the one or more fixed logic blocks and to the plurality of reprogrammable logic blocks according to a sequence of execution of the software program and wherein the instruction logic is further configured to wait until the reprogrammable portion returns a result from an operation performed according to an instruction of the software program before providing an immediately subsequent instruction of the software program to the fixed portion.

16. The family of two or more integrated circuit devices of claim 15, wherein the reprogrammable portions are subordinate to the fixed portion.

17. The family of two or more integrated circuit devices of claim 15, wherein the fixed portions are a software-programmable digital signal processor (DSP).

18. The family of two or more integrated circuit devices of claim 15, wherein the reprogrammable portions are a field-programmable gate array (FPGA).

19. The family of two or more integrated circuit devices of claim 15, wherein substantially all of the plurality of reprogrammable logic blocks of each family member are identical.

20. The family of two or more integrated circuit devices of claim 15, wherein the plurality of reprogrammable logic blocks of each family member include at least two different reprogrammable logic block types that differs by an amount of logic and/or a type of logic.

21. The family of two or more integrated circuit devices of claim 15, wherein the reprogrammable portion of each family member further comprises at least one application-specific function block.

22. The family of two or more integrated circuit devices of claim 21, wherein the at least one application-specific function block is a Multiplier, Barrel Shifter, Bit-Reverse Address Generator, Auto-Scaling Unit, Large Multiplier, or Viterbi Decoder.

23. The family of two or more integrated circuit devices of claim 15, wherein the fixed portion of each family member comprises the instruction logic.

24. The family of two or more integrated circuit devices of claim 15, wherein the instruction logic of each family member is at least partially reprogrammable to provide a reprogrammable instruction set.

25. The family of two or more integrated circuit devices of claim 24, wherein the at least partially reprogrammable instruction logic of each family member is configured to perform instruction decoding.

26. The family of two or more integrated circuit devices of claim 24, wherein the at least partially reprogrammable instruction logic of each family member comprises:
   a content-addressable memory (CAM) configured to accept results signals from the fixed function blocks, the reprogrammable logic blocks, and/or data path elements of the integrated circuit, and to encode the accepted results signals; and
   a memory element comprising:
      a first set of address inputs, coupled to outputs of the CAM, to receive
   an encoded signal from the CAM; and
   a second set of address inputs, coupled to an instruction fetch logic element of the integrated circuit, to accept instruction signals according to the software program, and to decode the encoded signal to control the plurality of reprogrammable logic blocks and/or the one or more fixed logic blocks.

* * * * *

UNITED STATES PATENT AND TRADEMARK OFFICE
CERTIFICATE OF CORRECTION

| | | |
|---|---|---|
| PATENT NO. | : 7,679,398 B2 | Page 1 of 1 |
| APPLICATION NO. | : 10/621957 | |
| DATED | : March 16, 2010 | |
| INVENTOR(S) | : Robert Osann, Jr. | |

It is certified that error appears in the above-identified patent and that said Letters Patent is hereby corrected as shown below:

On The Title Page, under Item (56) the U.S. PATENT DOCUMENTS subsection of the "References Cited" section --5,731,626 A 3/1998 Eaglesham et al.--

--6,037,640 A 3/2000 Lee--

--6,518,136 B2 2/2003 Lee et al.-- should be added

Signed and Sealed this

Eighteenth Day of May, 2010

David J. Kappos
*Director of the United States Patent and Trademark Office*